(12) United States Patent
Lim et al.

(10) Patent No.: US 9,112,093 B2
(45) Date of Patent: Aug. 18, 2015

(54) LIGHT EMITTING DEVICE

(71) Applicant: LG INNOTEK CO., LTD., Seoul (KR)

(72) Inventors: Hyun chul Lim, Seoul (KR); Jae Hoon Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/849,816

(22) Filed: Mar. 25, 2013

(65) Prior Publication Data

US 2014/0034958 A1    Feb. 6, 2014

(30) Foreign Application Priority Data

Aug. 6, 2012   (KR) .................. 10-2012-0085569

(51) Int. Cl.
   *H01L 33/14*      (2010.01)
   *H01L 33/00*      (2010.01)
   *H01L 33/32*      (2010.01)
   *H01L 33/06*      (2010.01)

(52) U.S. Cl.
   CPC ............. *H01L 33/145* (2013.01); *H01L 33/007* (2013.01); *H01L 33/06* (2013.01); *H01L 33/14* (2013.01); *H01L 33/32* (2013.01)

(58) Field of Classification Search
   None
   See application file for complete search history.

(56) References Cited

U.S. PATENT DOCUMENTS

| | | | |
|---|---|---|---|
| 5,363,399 A * | 11/1994 | Yagi ................................. 372/96 |
| 6,238,947 B1 * | 5/2001 | Shakuda .......................... 438/94 |
| 2004/0217371 A1 * | 11/2004 | Okumura ...................... 257/103 |
| 2010/0038674 A1 * | 2/2010 | Chen et al. .................... 257/102 |
| 2012/0187365 A1 * | 7/2012 | Jeong et al. ....................... 257/9 |

OTHER PUBLICATIONS

Kishino, K., Yamano, K., Goto, M., Ishizawa, S., Araki, R., Nagashima, K., Kikuchi, A., and Kouno, T. (2011). Regularly arranged InGaN-based nanocolumns and related device technology doi:http://dx.doi.org/10.1109/PHOTWTM.2011.5730079.*
Kishino et al, Citation/Abstract information from the INSPEC database for Kishino, K., Yamano, K., Goto, M., Ishizawa, S., Araki, R., Nagashima, K., Kikuchi, A., and Kouno, T. (2011). Regularly arranged InGaN-based nanocolumns and related device technology doi:http://dx.doi.org/10.1109/PHOTWTM.2011.5730079.*
Tu et al, "Improvement of Near-Ultraviolet InGaN-GaN Light-Emitting Diodes With an AlGaN Electron-Blocking Layer Grown at Low Temperature", IEEE Photonics Technology Letters, vol. 15, No. 10, Oct. 2003.*

* cited by examiner

*Primary Examiner* — Johannes P Mondt
(74) *Attorney, Agent, or Firm* — Ked & Associates, LLP

(57) ABSTRACT

A light emitting device is disclosed. The light emitting device includes a first-conductive-type semiconductor layer, a second-conductive-type semiconductor layer, and an active layer interposed between the first-conductive-type semiconductor layer and the second-conductive-type semiconductor layer. The second-conductive-type semiconductor layer includes an electron blocking region closely disposed to the active layer and having a pattern with a plurality of elements spaced apart from each other.

20 Claims, 21 Drawing Sheets

LIGHT EMITTING DEVICE

CROSS REFERENCE TO RELATED APPLICATION

This application claims priority to Korean Patent Application No. 10-2012-0085569, filed in Korea on Aug. 6, 2012, which are hereby incorporated in its entirety by reference as if fully set forth herein.

TECHNICAL FIELD

Embodiments relate to a light emitting device including an electron blocking layer having a pattern.

BACKGROUND

Light emitting devices such as light emitting diodes and laser diodes which use a Group III-V or Group II-VI semiconductor material may render various colors such as red, green, blue, and ultraviolet by virtue of development of thin film growth technologies and device materials. It may also be possible to produce white light at high efficiency using fluorescent materials or through color mixing. Furthermore, the light emitting devices have advantages such as low power consumption, semi-permanent lifespan, fast response time, safety, and environmental friendliness as compared to conventional light sources, such as fluorescent lamps and incandescent lamps.

Therefore, these light emitting devices are increasingly applied to transmission modules of optical communication units, light emitting diode backlights as a replacement for cold cathode fluorescence lamps (CCFLs) constituting backlights of liquid crystal display (LCD) devices, lighting apparatuses using white light emitting diodes as a replacement for fluorescent lamps or incandescent lamps, headlights for vehicles and traffic lights.

FIG. 1 is a cross-sectional view briefly illustrating a conventional light emitting device. The conventional light emitting device includes a substrate 10, a light emitting structure, which includes an n-GaN layer 20, an active layer 30, and a p-GaN layer 40, an n-electrode 60 disposed on the n-GaN layer 20, and a p-electrode disposed on the p-GaN layer 40.

The p-GaN layer 40 includes an electron blocking layer (EBL) 50 to be adjacent to the active layer 30. Since electrons have far greater mobility than holes, overflow of electrons out of the active layer 30 into the p-GaN layer 40 may be prevented by inserting the EBL 50 having a high energy barrier thereinto.

However, while internal quantum efficiency is improved by the EBL 50 via blocking overflow of electrons, the EBL 50 also blocks inflow of holes as a barrier.

SUMMARY

Embodiments provide a light emitting device having improved internal quantum efficiency by blocking overflow of electrons and improving hole injection efficiency.

In one embodiment, a light emitting device includes a first-conductive-type semiconductor layer, a second-conductive-type semiconductor layer, and an active layer interposed between the first-conductive-type semiconductor layer and the second-conductive-type semiconductor layer. The second-conductive-type semiconductor layer is closely disposed to the active layer and includes a plurality of electron blocking regions patterned to be spaced apart from each other.

Each of the electron blocking regions may include an AlGaN single layer, an AlGaN/GaN multilayer, or an InAlGaN/GaN multilayer.

The electron blocking regions may be patterned to form a periodic array.

Each of the electron blocking regions may have a width of 50 to 200 nm.

Each of the electron blocking regions may be spaced apart from an adjacent electron blocking region by a distance of 5 to 50 nm.

When electron blocking region is a first region, and a region disposed between adjacent first regions is a second region, a ratio of a width $W_2$ of the second region to the total of a width $W_1$ of the first region and the width $W_2$ of the second region $(W_1+W_2)$ may be in the range of 2.4 to 50%.

When the electron blocking region is a first region, and a region disposed between adjacent first regions is a second region, a ratio of an area of the second region to the total cross-sectional area of the light emitting device may be in the range of 5 to 80%.

When the electron blocking region is a first region, and a region disposed between adjacent first regions is a second region, the second region may have a smaller energy bandgap than the first region.

The light emitting device may further include a transparent electrode layer disposed on the second-conductive-type semiconductor layer.

In another embodiment, a light emitting device includes a first-conductive-type semiconductor layer, a second-conductive-type semiconductor layer, and an active layer interposed between the first-conductive-type semiconductor layer and the second-conductive-type semiconductor layer. The second-conductive-type semiconductor layer includes an electron blocking layer closely disposed to the active layer and a second-conductive-type clad layer disposed on the electron blocking layer. The electron blocking layer includes a plurality of first regions patterned to be spaced apart from each other and a second region disposed between adjacent first regions, the first region and the second region being formed of materials having different energy bandgaps.

Each of the first regions may be an electron blocking region and the second region may be a hole injection region The second region may include a material having the same composition as the second-conductive-type clad layer.

In another embodiment, a light emitting device includes a first-conductive-type semiconductor layer, a second-conductive-type semiconductor layer, and an active layer interposed between the first-conductive-type semiconductor layer and the second-conductive-type semiconductor layer. The second-conductive-type semiconductor layer includes an electron blocking layer closely disposed to the active layer and a second-conductive-type clad layer disposed on the electron blocking layer. The electron blocking layer includes a plurality of first regions patterned to be spaced apart from each other and a second region disposed between adjacent first regions. The second region includes a first layer closely disposed to the active layer and a second layer closely disposed to the second-conductive-type clad layer.

The first layer may include a material having the same composition as the first region.

The second layer may include a material having the same composition as the second-conductive-type clad layer.

The first layer may be thinner than the first region.

A surface of the first layer adjacent to the active layer may be aligned in the same line as a surface of the first region adjacent to the active layer.

The first layer may have a thickness of 1 to 20 nm.

The first layer may have a thickness of 10 to 50% of a thickness of the first region.

The first layer and the first region may be formed of materials having different energy bandgaps.

In another embodiment, a light emitting device includes a first-conductive-type semiconductor layer, a second-conductive-type semiconductor layer, and an active layer interposed between the first-conductive-type semiconductor layer and the second-conductive-type semiconductor layer. The second-conductive-type semiconductor layer includes an electron blocking layer closely disposed to the active layer. The electron blocking layer includes a first region and a second region having different thicknesses, a thickness of the first region being greater than a thickness of the second region.

A surface of the first region adjacent to the active layer may be aligned in the same line as a surface of the second region adjacent to the active layer.

In another embodiment, a light emitting device includes a first-conductive-type semiconductor layer, a second-conductive-type semiconductor layer, and an active layer interposed between the first-conductive-type semiconductor layer and the second-conductive-type semiconductor layer. The second-conductive-type semiconductor layer includes an electron blocking layer closely disposed to the active layer. The electron blocking layer may have a plurality of convex portions protruding in a direction away from the active layer.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
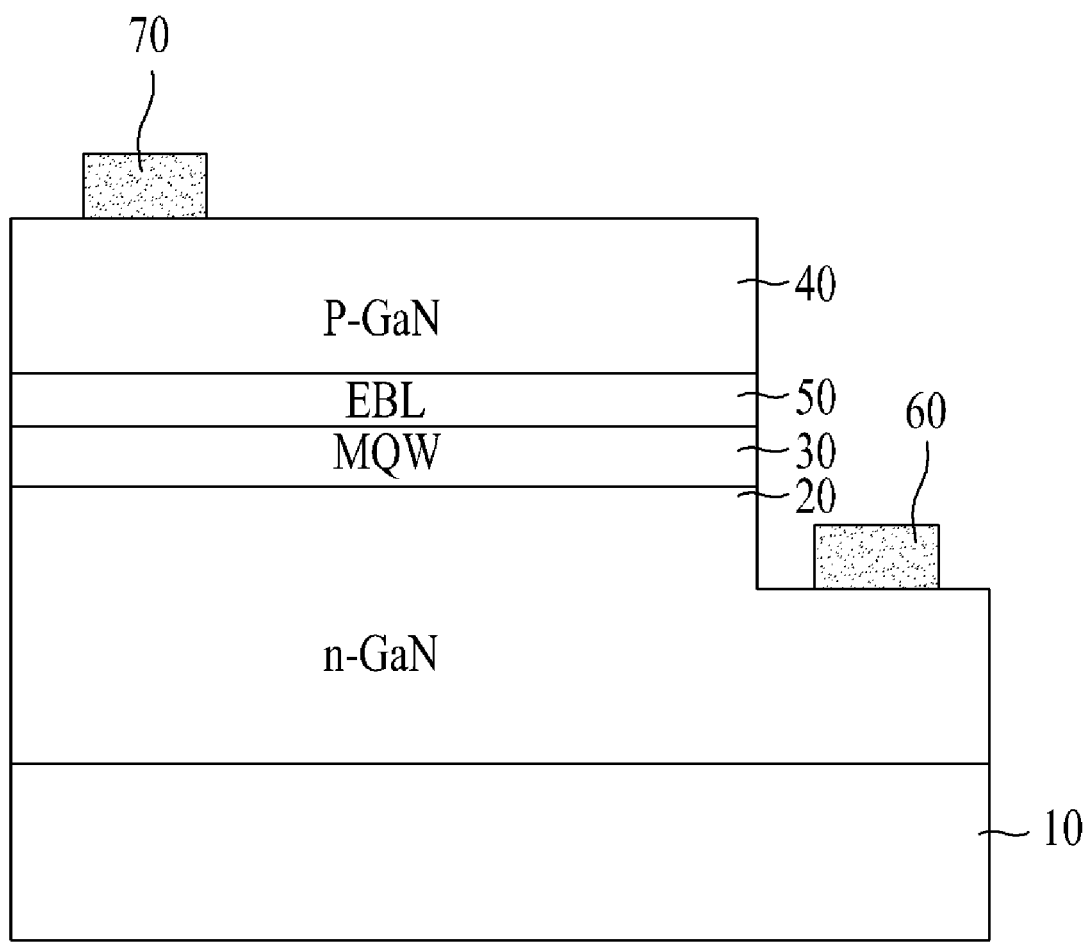
FIG. 1 is a cross-sectional view briefly illustrating a conventional light emitting device.

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thickness or size of each layer is exaggerated, omitted, or schematically illustrated for convenience of description and clarity. In addition, the size or area of each constituent element does not entirely reflect the actual size thereof.

Figure 2:
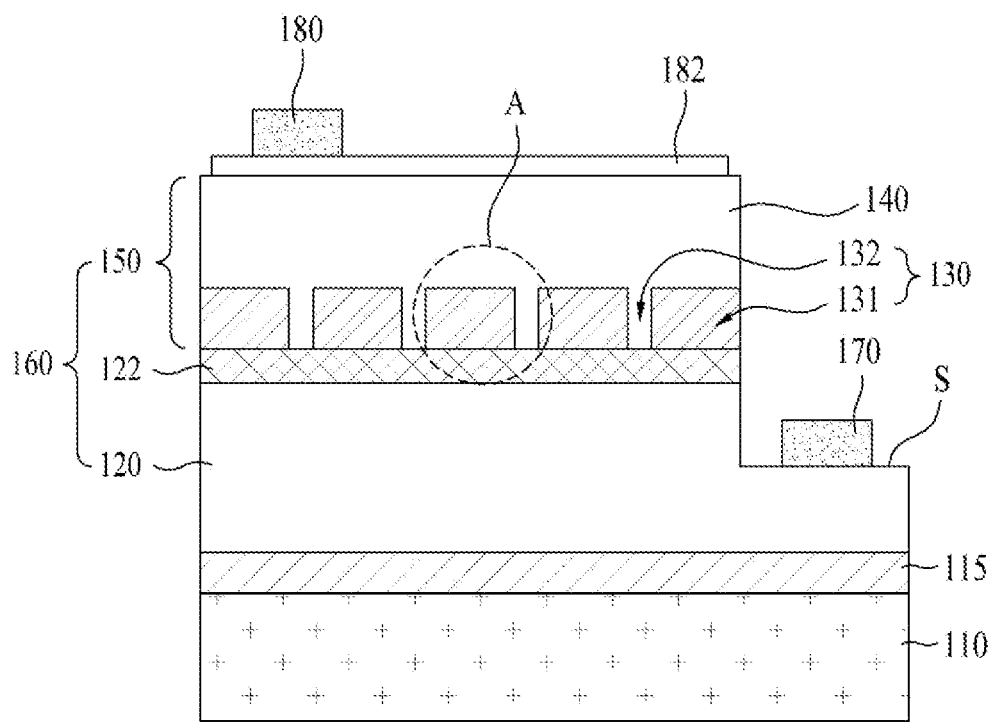
FIG. 2 is a cross-sectional view illustrating a light emitting device according to an exemplary embodiment.

FIG. 2 is a cross-sectional view illustrating a light emitting device 100A according to an exemplary embodiment.

Referring to FIG. 2, the light emitting device 100A according to the illustrated embodiment is a horizontal light emitting device including a first-conductive-type semiconductor layer 120, a second-conductive-type semiconductor layer 150, and an active layer interposed between the first-conductive-type semiconductor layer 120 and the second-conductive-type semiconductor layer 150.

The first-conductive-type semiconductor layer 120, the active layer 122, and the second-conductive-type semiconductor layer 150 may constitute a light emitting structure 160.

The light emitting device 100A includes a light emitting diode (LED) using a plurality of compound semiconductor layers, for example, Group III-V or Group II-VI element semiconductor layers. The LED may be a multi-color LED emitting blue, green, or red light, a white LED, or a UV LED. Light emitted from the LED may be rendered using various semiconductors without limitation.

The light emitting structure 160 may be formed using, for example, metal organic chemical vapor deposition (MOCVD), chemical vapor deposition (CVD), plasma-enhanced chemical vapor deposition (PECVD), molecular beam epitaxy (MBE), or hydride vapor phase epitaxy (HVPE), but the formation method is not limited thereto.

The first-conductive-type semiconductor layer 120 may be formed of a semiconductor compound, such as a Group III-V or Group II-VI compound semiconductor. In addition, a first-conductive-type dopant may be doped thereon. When the first-conductive-type semiconductor layer 120 is an n-type semiconductor layer, the first-conductive-type dopant may be an n-type dopant including Si, Ge, Sn, Se, Te, or the like, but the present disclosure is not limited thereto.

The first-conductive-type semiconductor layer 120 may include a semiconductor material represented by formula $Al_xIn_yGa_{1-x-y}N$ ($0 \leq x \leq 1$, $0 \leq y \leq 1$, and $0 \leq x+y \leq 1$). The first-conductive-type semiconductor layer 120 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The second-conductive-type semiconductor layer 150 may be formed of a semiconductor compound, for example, a Group III-V or Group II-VI compound semiconductor doped with a second-conductive-type dopant. The second-conductive-type semiconductor layer 150 may include a semiconductor material represented by formula $In_xAl_yGa_{1-x-y}N$ ($0 \leq x \leq 1$, $0 \leq y \leq 1$, and $0 \leq x+y \leq 1$). When the second-conductive-type semiconductor layer 150 is a p-type semiconductor layer, the second-conductive-type dopant may be a p-type dopant including Mg, Zn, Ca, Sr, Ba, or the like, but the present disclosure is not limited thereto.

According to the present embodiment, the first-conductive-type semiconductor layer 120 may be an n-type semiconductor layer, and the second-conductive-type semiconductor layer 150 may be a p-type semiconductor layer. In addition, a semiconductor having an opposite polarity to the second-conductive-type may be further disposed on the second-conductive-type semiconductor layer 150. For example, when the second-conductive-type semiconductor layer is a p-type semiconductor layer, an n-type semiconductor layer (not shown) may be disposed on the second-conductive-type semiconductor layer 150. Accordingly, the light emitting structure 160 may have an n-p junction structure, a p-n junction structure, an n-p-n junction structure, or a p-n-p junction structure.

The active layer 122 is interposed between the first-conductive-type semiconductor layer 120 and the second-conductive-type semiconductor layer 150.

The active layer 122 is a layer in which electrons meet holes to emit light with energy determined by an intrinsic energy band of the material of the active layer (light emitting layer) 122. When the first-conductive-type semiconductor layer 120 is an n-type semiconductor layer, and the second-conductive-type semiconductor layer 150 is a p-type semiconductor layer, electrons are injected from the first-conductive-type semiconductor layer 120 and holes are injected from the second-conductive-type semiconductor layer 150.

The active layer 122 may have at least one of a single quantum well structure, a multi quantum well structure, a quantum-wire structure, and a quantum dot structure. For example, the active layer 122 may have a multi quantum well structure through injection of tri-methyl gallium gas (TMGa), ammonia gas ($NH_3$), nitrogen gas ($N_2$), and tri-methyl indium gas (TMIn), but the present disclosure is not limited thereto.

When the active layer 122 has a quantum well structure, well/barrier layers of the active layer 122 may have a layered pair structure formed of at least one of InGaN/GaN, InGaN/InGaN, GaN/AlGaN, InAlGaN/GaN, GaAs(InGaAs)/AlGaAs, and GaP(InGaP)/AlGaP, but the present disclosure is not limited thereto. The well layer may be formed of a material having a smaller band gap than that of the barrier layer.

The second-conductive-type semiconductor layer 150 includes an electron blocking layer (EBL) 130 closely disposed to the active layer 122 and a second-conductive-type clad layer 140 disposed on the EBL 130. The second-conductive-type clad layer 140 has the same composition as the material used to form the second-conductive-type semiconductor layer 150, and thus a detailed description thereof is not given.

Since electrons injected from the first-conductive-type semiconductor layer 120 have high mobility, the EBL 130 functions as a potential barrier to prevent electrons, which cannot contribute to emission of light, from migrating over the active layer 122 to the second-conductive-type semiconductor layer 150, thereby preventing leakage current.

The EBL 130 has a plurality of first regions 131 patterned to be spaced apart from each other and a second region 132 disposed between adjacent first regions 131. That is, the EBL 130 may be an electron blocking pattern layer having patterned regions.

The first regions 131 of the EBL 130 may function as an electron blocking region that prevents overflow of electrons injected from the first-conductive-type semiconductor layer 120, and the second region 132 of the EBL 130 may function as a region for injecting holes supplied from the second-conductive-type semiconductor layer 150.

The first regions 131 of the EBL 130 may be formed of a material with a different energy bandgap from the second region 132 of the EBL 130. The first regions 131 may have a greater energy bandgap than that of the second region 132.

The first regions 131 may be formed of a material having a greater energy bandgap than that of the barrier layer of the active layer 122 or the second-conductive-type clad layer 140 and may have a formula $In_xAl_yGaN_{1-x-y}$ ($0 \leq X < Y < 1$). The first regions 131 may be formed as an AlGaN single layer or a multilayer of AlGaN/GaN or InAlGaN/GaN.

The second region 132 may have the same composition as the material used to form the second-conductive-type clad layer 140. That is, the plurality of first regions 131 are patterned to be spaced apart from each other, and the second region 132 formed of the same material as the second-conductive-type clad layer 140 is disposed in a space between adjacent first regions 131.

The second region 132 may have an energy bandgap that is the same as that of the second-conductive-type clad layer 140 and less than that of the first regions 131.

According to the present embodiment, overflow of electrons may be prevented by the first regions 131 of the EBL 130 having a greater energy bandgap, and holes may be efficiently injected into the active layer 122 via the second region 132 disposed between adjacent first regions 131.

In other words, since a conventional EBL only includes a first region 131 with a greater energy bandgap, the EBL blocks not only overflow of electrons but also injection of holes. According to the present embodiment, the EBL 130 includes the first regions 131 and the second region 132. Accordingly, internal quantum efficiency of the light emitting device 100A may be improved by blocking overflow of electrons and facilitating injection of holes.

Figure 3:
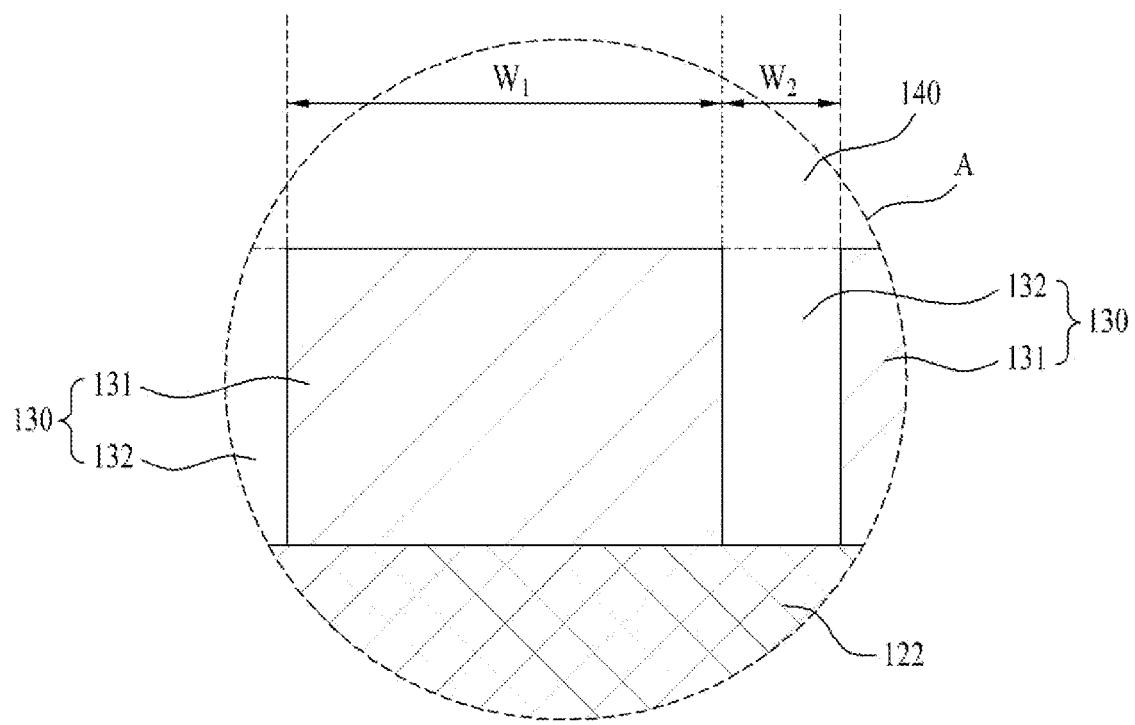
FIG. 3 is an enlarged view of a portion A of FIG. 1.
Figure 4A:
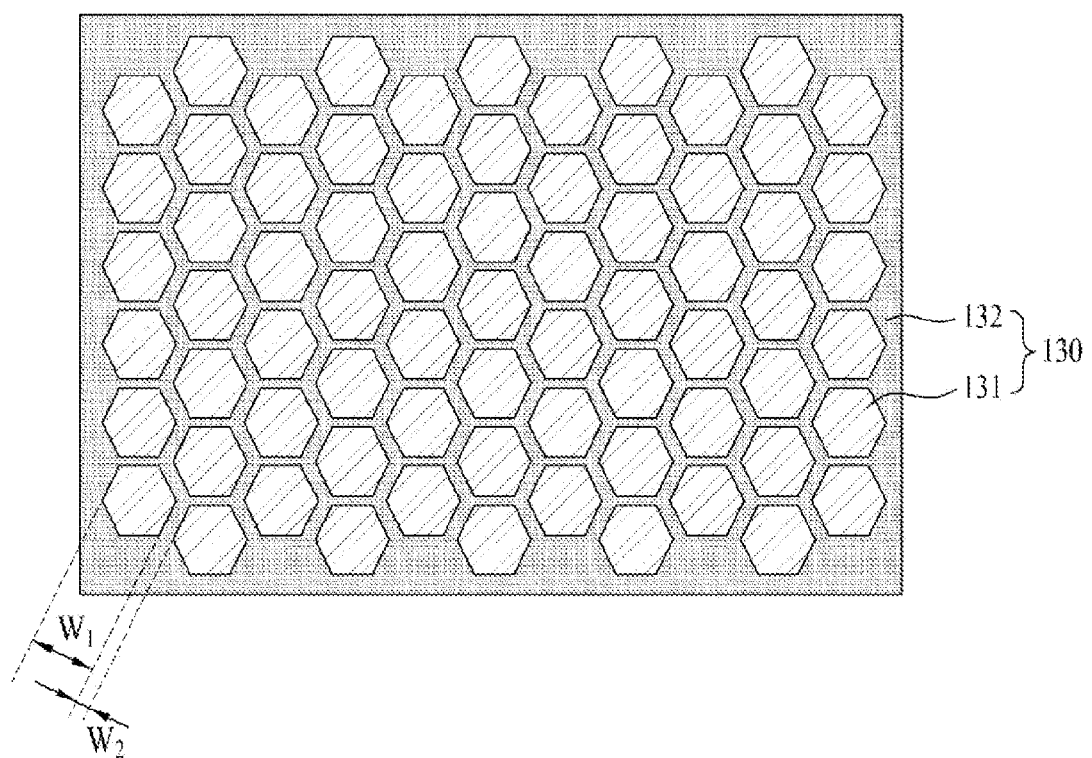
FIGS. 4A and 4B are horizontal cross-sectional views illustrating an electron blocking layer.
Figure 4B:
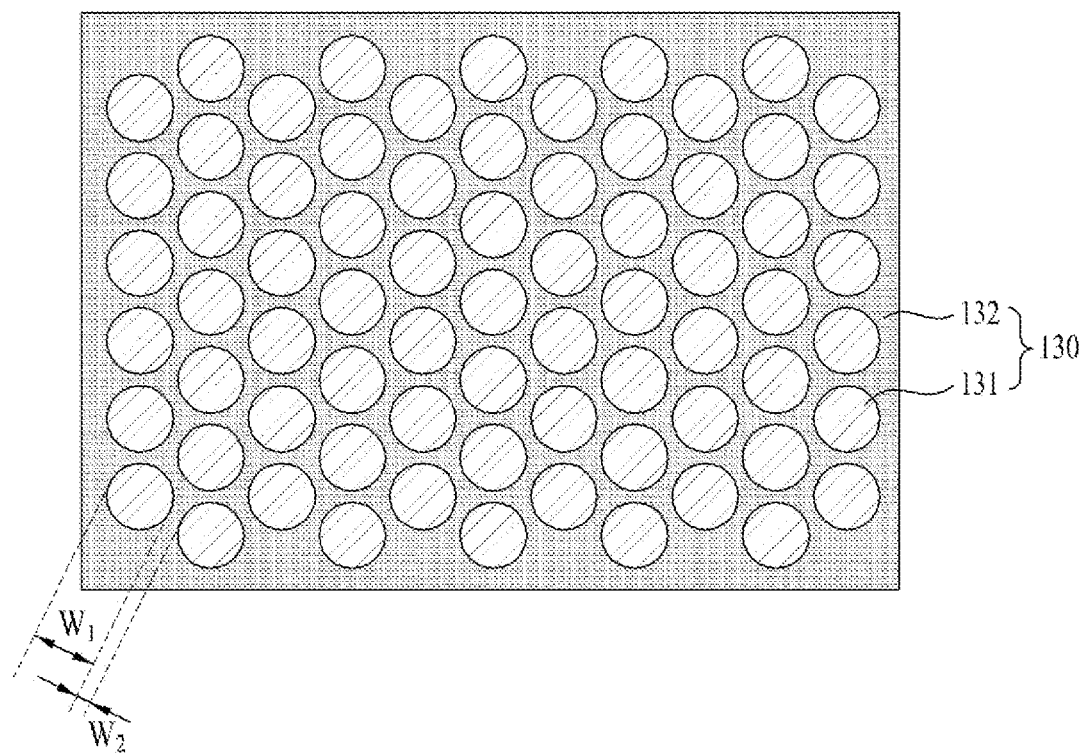

FIG. 3 is an enlarged view of a portion A of FIG. 1. FIGS. 4A and 4B are horizontal cross-sectional views illustrating an EBL. The EBL will be described in more detail with reference to FIGS. 3, 4A and 4B.

Referring to FIG. 3, the EBL 130 includes first regions 131 spaced apart from each other and a second region 132 disposed between adjacent first regions 131.

The second region 132 may have the same composition as the material used to form the second-conductive-type clad layer 140 disposed on the EBL 130. According to the present embodiment, the second region 132 and the second-conductive-type clad layer 140 may be consecutively formed.

Referring to FIGS. 4A and 4B, each of the first regions 131 may be patterned to have a predetermined shape. FIG. 4A illustrates that the first region 131 is patterned to have a polygonal, particularly, hexagonal cross-section. FIG. 4B illustrates that the first region 131 is patterned to have a circular cross-section. However, FIGS. 4A and 4B are examples, and the first region 131 may also be patterned to have a circular, oval, polygonal, or irregular cross-section.

In addition, the first regions 131 may be patterned to form a periodic array as illustrated in FIGS. 4A and 4B or an aperiodic array although not shown herein.

The periodic array refers to a uniform alignment in which the plurality of first regions 131 have the same shape and are spaced apart from each other by a predetermined distance.

The aperiodic array refers to a non-uniform alignment in which some of the first regions 131 have different shapes, or space between adjacent first regions 131 is not uniformly formed although the first regions 131 have the same shape.

In the aperiodic array, when the first regions 131 are not uniformly aligned within the light emitting device 100A, a great number of electrons may migrate out of the active layer 122 via regions where the first regions 132 are not formed, causing leakage current.

According to the present embodiment, each of the first regions 131 may have a width $W_1$ of 50 to 200 nm. The width $W_1$ of the first region 131 may refer to a diameter when the first region 131 has a circular cross-section or a distance between opposite sides when the first region 131 has a polygonal cross-section. When the width $W_1$ of each of the first region 131 is less than 50 nm, it is not possible to efficiently inhibit overflow of electrons toward the second-conductive-type semiconductor layer 150. On the other hand, when the width $W_1$ of the first region 131 is greater than 200 nm, a width $W_2$ of the second region 132 relatively decreases, so that effects of the present disclosure to block electrons and improve hole injection efficiency may not be sufficiently achieved.

According to the present embodiment, two adjacent first regions 131 may be spaced apart from each other by a distance $W_2$ of 5 to 50 nm. The distance $W_2$ between the adjacent first regions 131 may refer to the width $W_2$ of the second region 132. In addition, the distance $W_2$ between the adjacent first regions 131 may be the shortest distance between the adjacent first regions 131. Similarly, when the width $W_2$ of the second region 132 is less than 5 nm, effects of the present disclosure to block electrons and improve hole injection efficiency may not be sufficiently achieved. On the other hand, when the width $W_2$ of the second region 132 is greater than 50 nm, the width $W_1$ of the first region 131 relatively decreases, so that overflow of electrons into the second-conductive-type semiconductor layer 150 cannot be efficiently inhibited.

A width $W_2$ of the second region 132 between two adjacent first regions 131 may not always be the same as a width $W_2$ of the second region 132 between another two adjacent first regions 131. The width $W_2$ of the second region 132 between the two adjacent first regions 131 may vary according to the shape of the first region 131 and the measurement point between the same two adjacent first regions 131.

The width $W_1$ of the first region 131 and the width $W_2$ of the second region 132 may be determined in consideration of a relationship between the electron blocking and hole injection efficiencies. When width $W_1$ of the first region 131 is far greater than the width $W_2$ of the second region 132, electron blocking efficiency may be improved but hole injection efficiency may decrease. Accordingly, effects of the present disclosure may not be achieved.

For example, a ratio of the width $W_2$ of the second region 132 to the total of the width $W_1$ of the first region 131 and the width $W_2$ of the second region 132 ($W_1+W_2$) may be in the range of 2.4 to 50%.

For example, a ratio of an area of the second region 132 to the total cross-sectional area of the EBL 130 may be in the range of 5 to 80%.

According to the present embodiment, a driving voltage of the light emitting device 100A may be reduced by disposing the second region 132 with a lower resistance between the first regions 131 with a higher resistance.

In addition, since a material used to form the first region 131 including Al has a smaller lattice constant than a material used to form the active layer 122, stress is caused due to lattice mismatch between the first region 131 and the active layer 122. By disposing the second region 132 between the first regions 131, stress may be reduced compared to conventional structures in which the first regions 13 are only disposed on the active layer 122. As a result, crystalline quality of a semiconductor layer may be improved, and internal quantum efficiency may be improved.

Figure 5A:
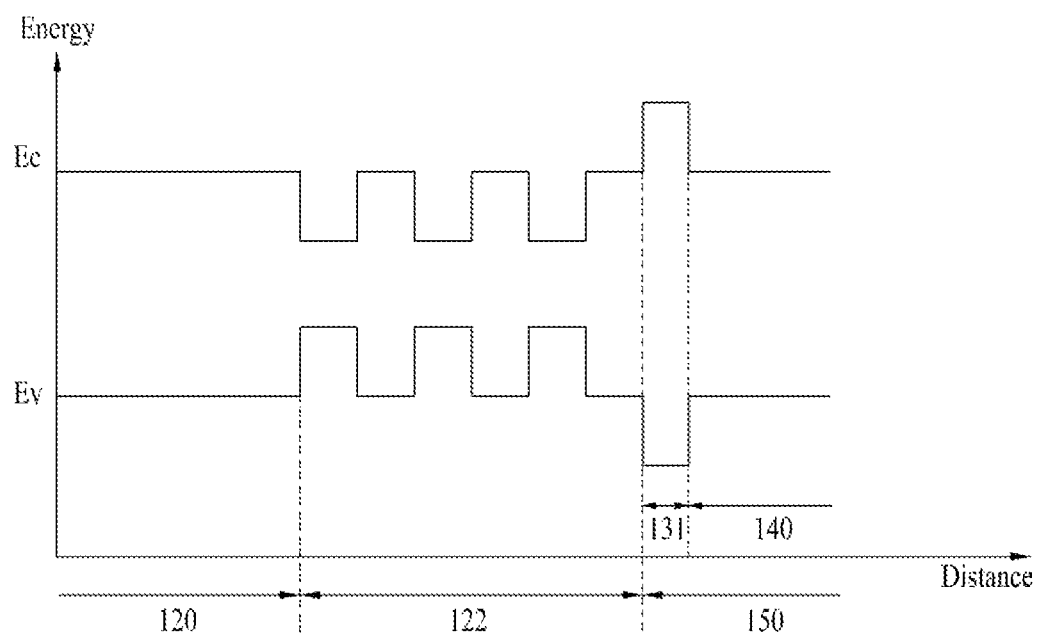
FIG. 5A is an energy band diagram of a light emitting device illustrating a first region of an electron blocking layer.
Figure 5B:
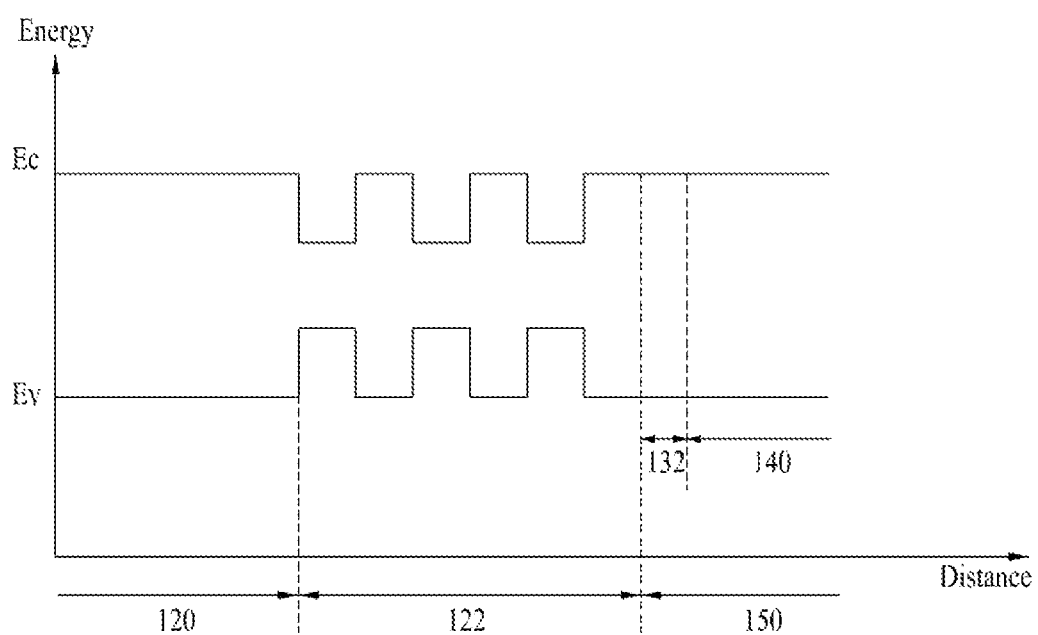
FIG. 5B is an energy band diagram of a light emitting device illustrating a second region of an electron blocking layer.

FIG. 5A is an energy band diagram of the light emitting device 100A illustrating the first region 131 of the EBL 130. FIG. 5B is an energy band diagram of the light emitting device 100A illustrating the second region 132 of the EBL 130. Referring to FIGS. 5A and 5B, effects of the EBL 130 provided at the light emitting device 100A of FIG. 2 will be described.

Referring to FIGS. 5A and 5B, the active layer 122 having a quantum well structure is disposed on the first-conductive-type semiconductor layer 120, and the second-conductive-type semiconductor layer 150 is disposed on the active layer 122.

The second-conductive-type semiconductor layer 150 includes the first regions 131 of the EBL 130 closely disposed to the active layer 122 and having a greater energy bandgap than the barrier layer of the active layer 122 (FIG. 5A) and the second region 132 disposed between adjacent first regions 131 and having the same energy bandgap as the barrier layer of the active layer 122 or the second-conductive-type clad layer 140 (FIG. 5B).

According to the embodiment illustrated in FIG. 2, overflow of electrons into the second-conductive-type semiconductor layer 150 causing leakage current may be prevented by disposing the first regions 131 having a greater energy bandgap on the active layer 122. Simultaneously, hole injection may be facilitated by disposing the second region 132 having a smaller energy bandgap than the first regions 131 between adjacent first regions 131. Holes may be injected into the active layer 122 via the second-conductive-type clad layer 140 and the second region 132 of the EBL 130.

Although FIG. 5B illustrates that the second region 132 of the EBL 130 and the second-conductive-type clad layer 140 are separately formed, the second region 132 and the second-conductive-type clad layer 140 may have the same composition and may be consecutively formed.

Referring back to FIG. 2, the light emitting structure 160 including the first-conductive-type semiconductor layer 120, the active layer 122, and the second-conductive-type semiconductor layer 150 may be disposed on the substrate 110.

The substrate 110 may be formed using a material suitable for growth of a semiconductor material or a material having excellent thermal conductivity. The substrate 110 may be formed of at least one selected from the group consisting of sapphire ($Al_2O_3$), SiC, GaAs, GaN, ZnO, Si, GaP, InP, Ge, and $Ga_2O_3$. Wet washing may be performed upon the substrate 110 to remove impurities from the surface of the substrate 110.

A buffer layer 115 may be interposed between the light emitting structure 160 and the substrate 110. The buffer layer 115 is adapted to reduce lattice mismatch and differences of coefficient of thermal expansion between the material of the light emitting structure 160 and the material of the substrate 110. The buffer layer 115 may be formed of a Group III-V compound semiconductor, for example, at least one selected from the group consisting of GaN, InN, AlN, InGaN, InAlGaN, and AlInN.

An undoped semiconductor layer (not shown) may be disposed in the first-conductive-type semiconductor layer 120 that is closely disposed to the substrate 110. The undoped semiconductor layer is formed to achieve an enhancement in the crystallinity of the first-conductive-type semiconductor layer 120. The undoped semiconductor layer may be identical to the first-conductive-type semiconductor layer 120, except that the undoped semiconductor layer has a lower electrical conductivity than the first-conductive-type semiconductor layer 120 since the undoped semiconductor layer is not doped with an n-type dopant.

The first-conductive-type semiconductor layer 120 includes an exposed surface S formed by selectively etching at least one portion of each of the second-conductive-type semiconductor layer 150 and the active layer 122. A first electrode 170 is disposed on the exposed surface S, and a second electrode 180 is disposed on a non-etched portion of the second-conductive-type semiconductor layer 150.

The first electrode 170 and the second electrode 180 may have a single layer or multilayer structure including at least one selected from the group consisting of molybdenum (Mo), chromium (Cr), nickel (Ni), gold (Au), aluminum (Al), titanium (Ti), platinum (Pt), vanadium (V), tungsten (W), lead (Pd), copper (Cu), rhodium (Rh), and iridium (Ir).

Before forming the second electrode 180, a transparent electrode layer 182 may be disposed on the second-conductive-type semiconductor layer 150.

The transparent electrode layer 182 is adapted to improve electrical properties of the second-conductive-type semiconductor layer 150 and to improve electrical contact with the second electrode 180. The transparent electrode layer 182 may be formed as a film or have a plurality of patterns.

For the transparent electrode layer 182, a light-transmitting conductive layer or a metal may be selectively used. For example, the transparent electrode layer 182 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but the present disclosure is not limited thereto.

Figure 6:
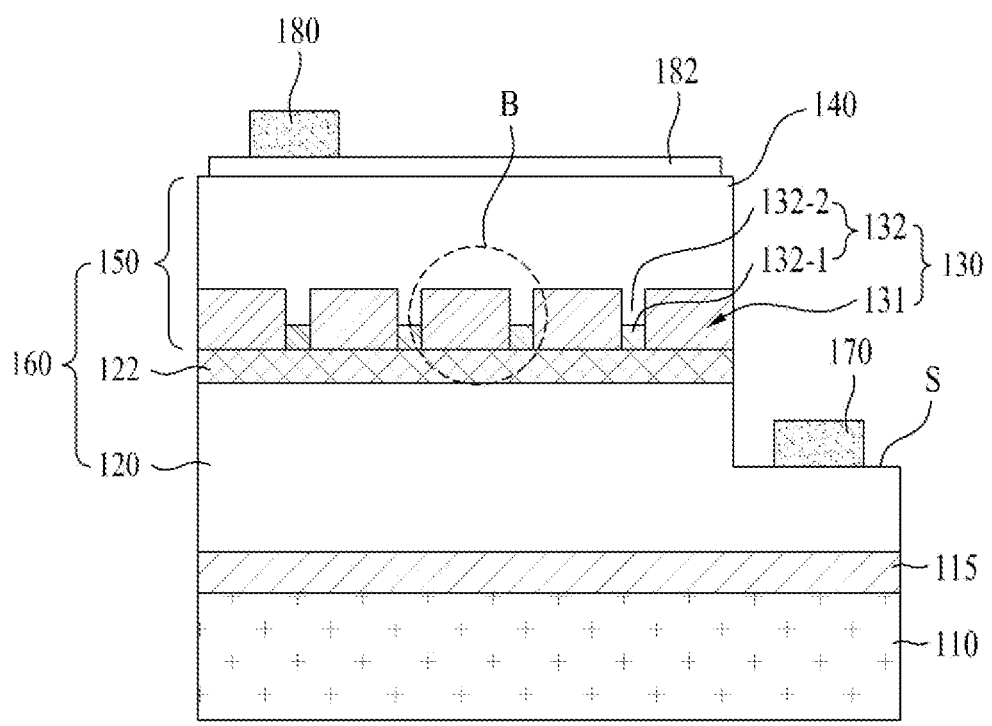
FIG. 6 is a cross-sectional view illustrating a light emitting device according to another embodiment.

FIG. 6 is a cross-sectional view illustrating a light emitting device 100B according to another embodiment. No description will be given of the configuration of FIG. 6 identical to the configuration described above. That is, the following description will be given only in conjunction with configurations different from those described above.

Referring to FIG. 6, the light emitting device 100B according to the illustrated embodiment is a horizontal light emitting device including a first-conductive-type semiconductor layer 120, a second-conductive-type semiconductor layer 150, and an active layer 122 interposed between the first-conductive-type semiconductor layer 120 and the second-conductive-type semiconductor layer 150.

The first-conductive-type semiconductor layer 120, the active layer 122, and the second-conductive-type semiconductor layer 150 may constitute a light emitting structure 160.

The second-conductive-type semiconductor layer 150 includes an EBL 130 closely disposed to the active layer 122, for example, disposed directly on the active layer, and a second-conductive-type clad layer 140 disposed on the EBL 130.

The EBL 130 has first regions 131 patterned to be spaced apart from each other and a second region 132 disposed between adjacent first regions 131. That is, the EBL 130 may be an electron blocking pattern layer having patterned regions.

The first regions 131 of the EBL 130 may function as an electron blocking region that prevents overflow of electrons injected from the first-conductive-type semiconductor layer 120, and the second region 132 of the EBL 130 may function as a region for injecting holes supplied from the second-conductive-type semiconductor layer 150. That is, the first regions 131 of the EBL 130 may have a greater energy bandgap than that of the second-conductive-type semiconductor layer 150 so as to function as an electron blocking region preventing overflow of electrons. The second region 132 of the EBL 130 may have has a smaller energy bandgap than that of the first regions 131 or may have an energy band gap that is the same as or smaller than that of the second-conductive-type semiconductor layer 150. Accordingly, the second region 132 may function as a hole injection region through which holes from the second-conductive-type semiconductor layer 150 are injected. According to the embodiment illustrated in FIG. 6, the second region 132 of the EBL 130 may have a greater energy bandgap than the second-conductive-type semiconductor layer 150 and a smaller thickness than the first region 131, so that the second region 132 of the EBL 130 may simultaneously function as an electron blocking region and a hole injection region improving hole injection efficiency.

The first regions 131 may be formed of a material having a greater energy bandgap than that of the barrier layer of the active layer 122 or the second-conductive-type clad layer 140 and may have a formula of $In_xAl_yGaN_{1-x-y}$ ($0 \leq X < Y < 1$). The first regions 131 may be an AlGaN single layer or a multilayer of AlGaN/GaN or InAlGaN/GaN.

The second region 132 includes a first layer 132-1 disposed close to the active layer 122, for example, directly disposed on the active layer, and a second layer 132-2 disposed close to the second-conductive-type clad layer 140.

The first layer 132-1 of the second region 132 may include a material having the same composition as the first region 131, and the second layer 132-2 of the second region 132 may include a material having the same composition as the second-conductive-type clad layer 140. Thus, the first layer 132-1 may have a greater energy bandgap than the second layer 132-2, and the second layer 132-2 may have a smaller energy bandgap than the first region 131. Alternatively, according to the present embodiment, the first layer 132-1 and the first region 131 may be formed of materials having different energy bandgaps. Since the first region 131 is an electron blocking region, and the second region 132 is a hole injection region, the energy bandgaps may decrease in the order of the first region 131, the first layer 132-1, and the second layer 132-2.

Figure 7:
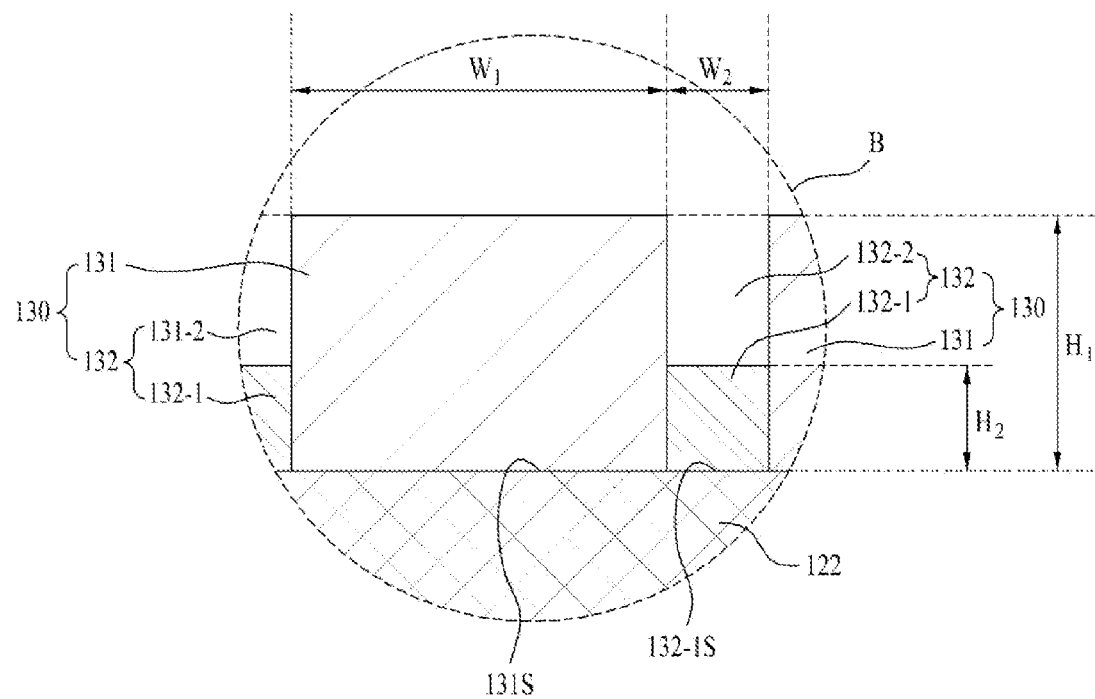
FIG. 7 is an enlarged view of a portion B of FIG. 6.

FIG. 7 is an enlarged view of a portion B of FIG. 6. The EBL 130 of FIG. 6 has a similar horizontal cross-section to those of FIGS. 4A and 4B, and thus a detailed description and drawings thereof will not be given.

Referring to FIG. 7, the first layer 132-1 of the second region 132 is disposed such that a surface 132-1S of the first layer 132-1 adjacent to the active layer 122 is aligned in the same line as a surface 131S of the first region 131 adjacent to the active layer 122.

In addition, the first layer 132-1 has a smaller height $H_2$ than a height $H_1$ of the first region 131. That is, a thickness of the first layer 132-1 is smaller than that of the first region 131.

Since the first layer 132-1 of the second region 132 has the same composition as the material used to form the first region 131, the first layer 132-1 may also function as an electron blocking layer in the same manner as the first region 131. However, the first layer 132-1 of the second region 132 is thinner than the first region 131. Thus, electron blocking efficiency of the first layer 132-1 is less than that of the first region 131, but hole injection efficiency into the active layer 122 is improved.

Simulation results showing hole concentrations in well layers of active layers are listed in Table 1 below when an EBL with a thickness of 40 nm and an EBL with a thickness of 4 nm were used.

TABLE 1

|  | EBL (40 nm) | EBL (4 nm) |
|---|---|---|
| Hole concentration in well layer | 1.40E+19 | 2.76E+19 |

Referring to Table 1, it was confirmed that hole injection efficiency was improved by use of the EBL with a thickness of 4 nm in comparison to the EBL with a thickness of 40 nm.

That is, according to the present embodiment, overflow of electrons may be prevented by the first regions 131 of the EBL 130, and holes may be efficiently injected into the active layer 122 through the second region 132 disposed between adjacent first regions 131. Particularly, by use of the first layer 132-1 of the second region 132 having a smaller thickness than the first region 131, overflow of electrons may be prevented and hole injection efficiency may be improved, thereby improving internal quantum efficiency of the light emitting device 100B.

For example, the first layer 132-1 may have a height $H_2$, i.e., thickness, of 1 to 20 nm. When the thickness of the first layer 132-1 is less than 1 nm, effects on improving hole injection efficiency may be negligible. On the other hand, when the thickness of the first layer 132-1 is greater than 20 nm, electron blocking efficiency is relatively greater than hole injection efficiency. Thus, desired effects according to the present embodiment may not be achieved.

The height $H_2$, i.e., thickness, of the first layer 132-1 may be in the range of 10 to 50% of the height $H_1$, i.e., thickness, of the first region 131. Similarly, when the thickness of the first layer 132-1 is less than 10% of that of the first region 131, effects on improving hole injection efficiency may be negligible. On the other hand, when the thickness of the first layer 132-1 is greater than 50% of that of the first region 131, electron blocking efficiency is relatively greater than hole injection efficiency. Thus, desired effects according to the present embodiment may not be achieved.

According to the present embodiment, each of the first regions 131 may have a width of 50 to 200 nm. The width $W_1$ of the first region 131 may refer to a diameter when the first region 131 has a circular cross-section or a distance between opposite sides when the first region 131 has a polygonal cross-section. When the width $W_1$ of the first region 131 is less than nm, it is not possible to efficiently inhibit overflow of electrons into the second-conductive-type semiconductor layer 150. On the other hand, when the width $W_1$ of the first region 131 is greater than 200 nm, a width $W_2$ of the second region 132 relatively decreases, so that effects of the present disclosure to simultaneously block electrons and improve hole injection efficiency may not be sufficiently achieved.

According to the present embodiment, two adjacent first regions 131 may be spaced apart from each other by a distance $W_2$ of 5 to 50 nm. The distance $W_2$ between the adjacent first regions 131 may refer to the width $W_2$ of the second region 132. In addition, the distance $W_2$ between the adjacent first regions 131 may be the shortest distance between the adjacent first regions 131. Similarly, when the width $W_2$ of the second region 132 is less than 5 nm, effects of the present disclosure to simultaneously block electrons and improve hole injection efficiency may not be sufficiently achieved. On the other hand, when the width $W_2$ of the second region 132 is greater than 50 nm, the width $W_1$ of the first region 131 relatively decreases, so that overflow of electrons into the second-conductive-type semiconductor layer 150 cannot be efficiently inhibited.

A width $W_2$ of the second region 132 between two adjacent first regions 131 may not always be the same as a width $W_2$ of the second region 132 between another two adjacent first regions 131. The width $W_2$ of the second region 132 between the two adjacent first regions 131 may vary according to the shape of the first regions 131 and the measurement point between the same two adjacent first regions 131.

The width $W_1$ of the first region 131 and the width $W_2$ of the second region 132 may be determined in consideration of a relationship between the electron blocking and hole injection efficiencies. When the first region 131 has a far greater width $W_1$ than the width $W_2$ of the second region 132, electron blocking efficiency may be improved but hole injection efficiency may decrease. Accordingly, effects of the present disclosure may not be achieved.

For example, a ratio of the width $W_2$ of the second region 132 to the total of the width $W_1$ of the first region 131 and the width $W_2$ of the second region 132 ($W_1+W_2$) may be in the range of 2.4 to 50%.

For example, a ratio of an area of the second region 132 to the total cross-sectional area of the EBL 130 may be in the range of 5 to 80%.

As described above in the embodiment illustrated in FIG. 2, the first regions 131 may be patterned to form a periodic array or an aperiodic array.

Figure 8:
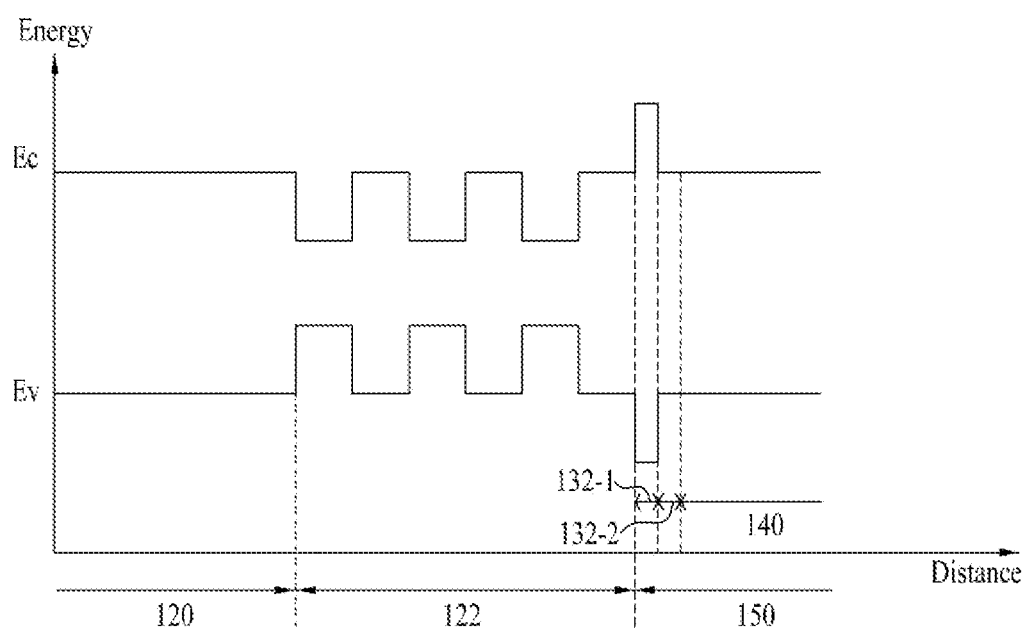
FIG. 8 is an energy band diagram of a light emitting device illustrating a second region of an electron blocking layer.

FIG. 8 is an energy band diagram of the light emitting device 100B illustrating the second region 132 of the EBL 130. An energy bandgap diagram of the first region 131 of the EBL 130 of the light emitting device 100B is described above with reference to FIG. 5A. Referring to FIGS. 8 and 5A, effects of the EBL 130 constituting the light emitting device 100B of FIG. 8 will be described.

Referring to FIG. 8, the active layer 122 having a quantum well structure is disposed on the first-conductive-type semiconductor layer 120, and the second-conductive-type semiconductor layer 150 is disposed on the active layer 122.

The second-conductive-type semiconductor layer 150 includes the first regions 131 of the EBL 130 closely disposed to the active layer 122 and having a greater energy bandgap than the barrier layer of the active layer 122 (FIG. 5A) and the second region 132 disposed between adjacent first regions 131. The second region 132 includes a first layer 132-1 closely disposed to the active layer 122 and having a greater energy bandgap than the barrier layer of the active layer 122 and a second layer 132-2 having the same energy bandgap as the barrier layer of the active layer 12 or the second-conductive-type clad layer 140 (FIG. 8). The energy bandgap of the first region 131 may be the same as that of the first layer 132-1 of the second region 132, but the present disclosure is not limited thereto. In comparison between FIGS. 8 and 5A, the first layer 132-1 of the second region 132 is thinner than the first region 131.

According to the embodiment illustrated in FIG. 6, overflow of electrons into the second-conductive-type semiconductor layer 150 causing leakage current may be prevented by disposing the first regions 131 having a greater energy bandgap on the active layer 122. Simultaneously, by use of the second region 132 disposed between adjacent first regions 131, electron blocking and hole injection may be efficiently performed, simultaneously.

Although FIG. 8 illustrates that the second layer 132-2 of the second region 132 and the second-conductive-type clad layer 140 are separately formed, the second layer 132-2 of the second region 132 and the second-conductive-type clad layer 140 may have the same composition and may be consecutively formed.

Figure 9:
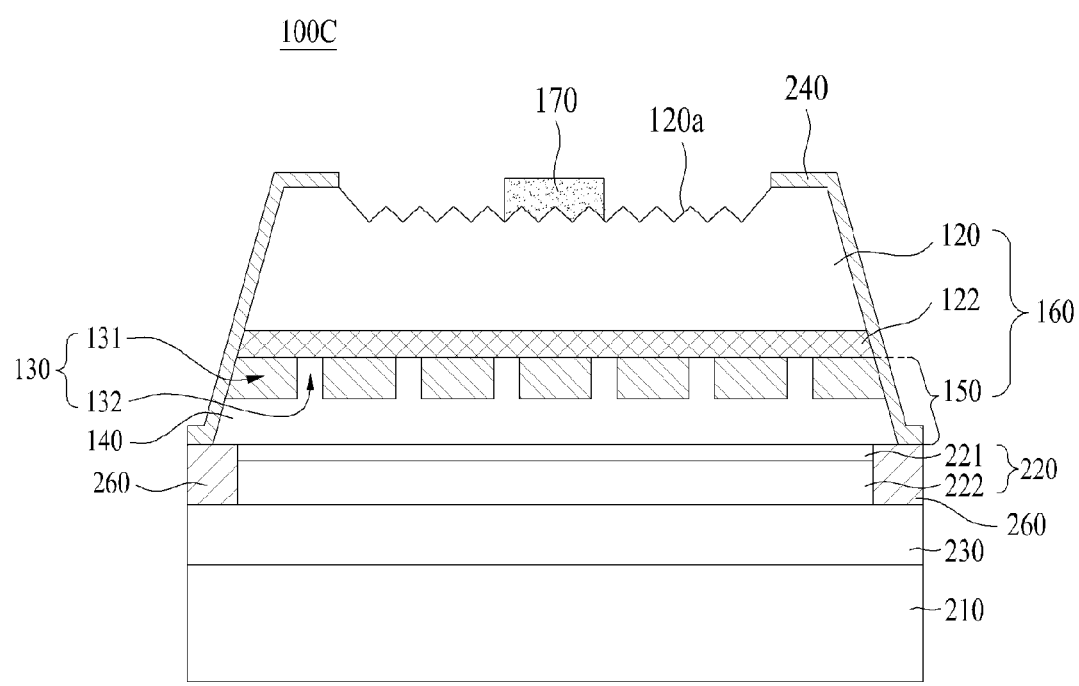
FIG. 9 is a cross-sectional view illustrating a light emitting device according to another embodiment.

FIG. 9 is a cross-sectional view illustrating a light emitting device 100C according to another embodiment. No description will be given of the configuration of FIG. 9 identical to the configurations described above. That is, the following description will be given only in conjunction with configurations different from those described above.

Referring to FIG. 9, the light emitting device 100C according to the illustrated embodiment is a vertical light emitting device including a first-conductive-type semiconductor layer 120, a second-conductive-type semiconductor layer 150, and an active layer 122 interposed between the first-conductive-type semiconductor layer 120 and the second-conductive-type semiconductor layer 150.

The first-conductive-type semiconductor layer 120, the active layer 122, and the second-conductive-type semiconductor layer 150 may constitute a light emitting structure 160.

The second-conductive-type semiconductor layer 150 includes an EBL 130 closely disposed to the active layer 122 and a second-conductive-type clad layer 140 disposed on the EBL 130.

The EBL 130 has first regions 131 patterned to be spaced apart from each other and a second region 132 disposed between adjacent first regions 131. That is, the EBL 130 may be an electron blocking pattern layer having patterned regions.

The first regions 131 of the EBL 130 may function as an electron blocking region that prevents overflow of electrons injected from the first-conductive-type semiconductor layer 120, and the second region 132 of the EBL 130 may function as a region for injecting holes supplied from the second-conductive-type semiconductor layer 150.

The first regions 131 of the EBL 130 may be formed of a material with a different energy bandgap from the second region 132 of the EBL 130. The first regions 131 may have a greater energy bandgap than that of the second region 132.

According to the present embodiment, overflow of electrons may be prevented by the first regions 131 of the EBL 130 having a greater energy bandgap, and holes may be efficiently injected into the active layer 122 via the second region 132 disposed between adjacent first regions 131.

The pattern and alignment of the first regions 131 and widths of the first regions 131 and the second region 132 are described above with reference to the embodiment illustrated in FIG. 2, and thus a detailed description thereof will not be repeated.

A first electrode 170 is disposed on the first-conductive-type semiconductor layer 120, and the second electrode layer 220 is disposed on the second-conductive-type semiconductor layer 150.

The second electrode layer 220 may include at least one of a transparent electrode layer 221 or a reflective layer 222.

For the transparent electrode layer 221, a light-transmissive conductive layer or a metal may be selectively used to improve electrical contact between the second-conductive-type semiconductor layer 150 and the second electrode layer 220. For example, the transparent electrode layer 221 may be formed of at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, or Ni/IrOx/Au/ITO, Ag, Ni, Cr, Ti, Al, Rh, Pd, Ir, Sn, In, Ru, Mg, Zn, Pt, Au, and Hf, but the present disclosure is not limited thereto.

The reflective layer 222 reflects light generated in the active layer 122 to reduce the amount of light disappearing inside the light emitting device 100C, thereby improving external quantum efficiency of the light emitting device 100C.

The reflective layer 222 may include at least one selected from the group consisting of Ag, Ti, Ni, Cr, and AgCu, but the present disclosure is not limited thereto.

When the reflective layer 222 is made of a material ohmic-contacting the second-conductive-type semiconductor layer 150, the transparent electrode layer 221 need not be separately formed.

The light emitting structure 160 is supported by a support substrate 210.

The support substrate 210 may be made of a material having high electrical conductivity and high thermal conductivity. For example, the support substrate 210 may be formed as a base substrate having a predetermined thickness, using a material selected from the group consisting of molybdenum (Mo), silicon (Si), tungsten (W), copper (Cu), aluminum (Al), and alloys thereof. In addition, the support substrate 210 may selectively include gold (Au), a Cu alloy, nickel (Ni), Cu—W, a carrier wafer (for example, GaN, Si, Ge, GaAs, ZnO, SiGe, SiC, SiGe, $Ga_2O_3$, or the like), a conductive sheet, or the like.

The light emitting structure 160 including the second-conductive-type semiconductor layer 150 on which the second electrode layer 220 is formed is bonded to the support substrate 210 via a bonding layer 230.

The bonding layer 230 may include a barrier metal or a bonding metal, for example, at least one selected from the group consisting of Ti, Au, Sn, Ni, Cr, Ga, In, Bi, Cu, Ag, and Ta, but the present disclosure is not limited thereto.

A roughness pattern 120a may be disposed on the surface of the first-conductive-type semiconductor layer 120 of the light emitting structure 160. The roughness pattern 120a may be formed via photo enhanced chemical (PEC) etching or an etching process using a mask pattern. The roughness pattern 120a is formed to improve extraction efficiency of light generated by the active layer 122 and may have a regular or irregular pattern.

A channel layer 260 may be disposed at a lower circumferential area of the light emitting structure 160. The channel layer 260 may protect the light emitting structure 160 and function as a stop layer during isolation etching in a process of manufacturing the light emitting device.

The channel layer 260 may be formed at a lower circumferential area of the second-conductive-type semiconductor layer 150 of the light emitting structure 160 in a pattern having a loop, ring, or frame shape.

The channel layer 260 prevents short-circuit of the light emitting structure 160 even when external walls thereof are exposed to humidity. Thus, a light emitting device having high resistance to humidity may be provided.

The channel layer 260 may be formed of an oxide, a nitride, or an insulating material, such as indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$, or $TiO_2$, but the present disclosure is not limited thereto.

In addition, a passivation layer 240 may be formed to surround at least one portion of the upper surface of the light emitting structure 160 or sides thereof.

The passivation layer 240 may be formed of an oxide or a nitride to protect the light emitting structure 160. For example, the passivation layer 240 may include a silicon oxide film (SiO$_2$), silicon nitride film, oxynitride film, or aluminum oxide film, but is not limited thereto.

Figure 10:
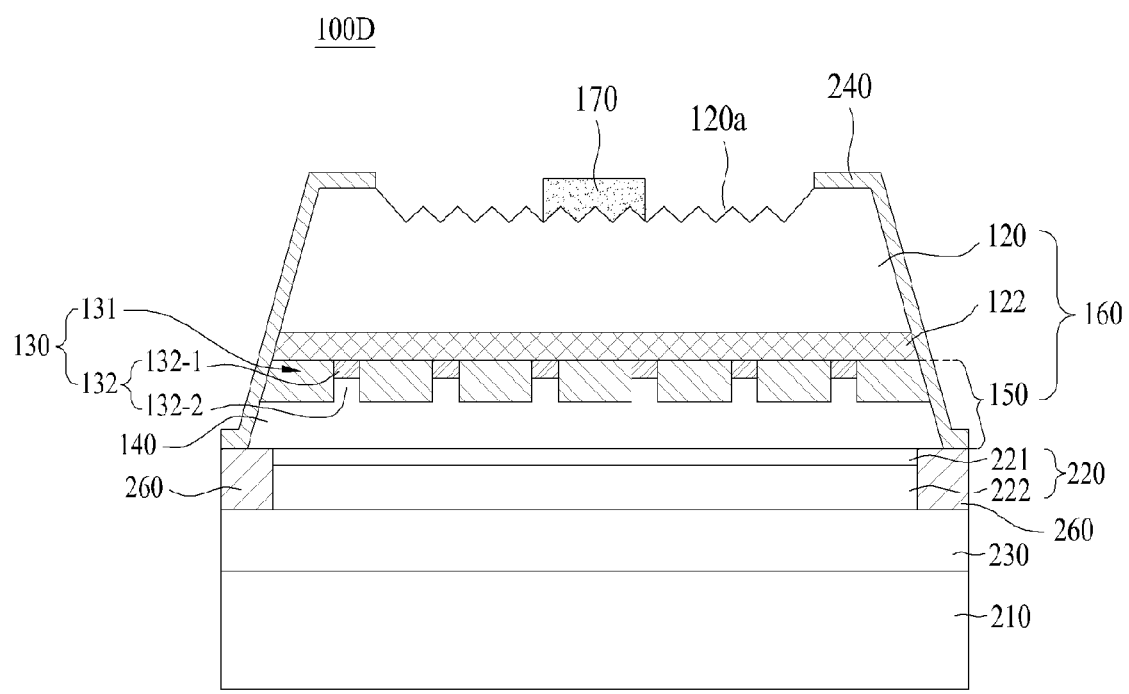
FIG. 10 is a cross-sectional view illustrating a light emitting device according to another embodiment.

FIG. 10 is a cross-sectional view illustrating a light emitting device 100D according to another embodiment. No description will be given of the configuration of FIG. 10 identical to the configurations described above. That is, the following description will be given only in conjunction with configurations different from those described above.

Referring to FIG. 10, the light emitting device 100D according to the illustrated embodiment is a vertical light emitting device including a first-conductive-type semiconductor layer 120, a second-conductive-type semiconductor layer 150, and an active layer 122 interposed between the first-conductive-type semiconductor layer 120 and the second-conductive-type semiconductor layer 150.

The first-conductive-type semiconductor layer 120, the active layer 122, and the second-conductive-type semiconductor layer 150 may constitute a light emitting structure 160.

The second-conductive-type semiconductor layer 150 includes an EBL 130 closely disposed to the active layer 122 and a second-conductive-type clad layer 140 disposed on the EBL 130.

The EBL 130 has first regions 131 patterned to be spaced apart from each other and a second region 132 disposed between adjacent first regions 131. That is, the EBL 130 may be an electron blocking pattern layer having patterned regions.

The first regions 131 of the EBL 130 may function as an electron blocking region that prevents overflow of electrons injected from the first-conductive-type semiconductor layer 120, and the second region 132 of the EBL 130 may function as a region for injecting holes supplied from the second-conductive-type semiconductor layer 150. According to the present embodiment, the second region 132 of the EBL 130 may function as an electron blocking and hole injection region.

The second region 132 includes a first layer 132-1 closely disposed to the active layer 122 and a second layer 132-2 closely disposed to the second-conductive-type clad layer 140

The first layer 132-1 of the second region 132 may include a material having the same composition as the first region 131, and the second layer 132-2 of the second region 132 may include a material having the same composition as the second-conductive-type clad layer 140. Thus, the first layer 132-1 may have a greater energy bandgap than the second layer 132-2, and the second layer 132-2 may have a smaller energy bandgap than the first region 131.

Alternatively, according to the present embodiment, the first layer 132-1 and the first region 131 may be formed of materials having different energy bandgaps. Since the first region 131 is an electron blocking region, and the second region 132 is a hole injection region, the energy bandgaps may decrease in the order of the first region 131, the first layer 132-1, and the second layer 132-2.

The first layer 132-1 of the second region 132 is disposed such that a surface of the first layer 132-1 adjacent to the active layer 122 is aligned in the same line as a surface of the first region 131 adjacent to the active layer 122.

In addition, the first layer 132-1 has a smaller height than that of the first region 131. That is, a thickness of the first layer 132-1 is smaller than that of the first region 131.

Since the first layer 132-1 of the second region 132 has the same composition as the material used to form the first region 131, the first layer 132-1 may also function as electron blocking layer in the same manner as the first region 131. However, the first layer 132-1 of the second region 132 is thinner than the first region 131. Thus, while electron blocking efficiency of the first layer 132-1 is less than that of the first region 131, hole injection efficiency into the active layer 122 may be improved.

The pattern and alignment of the first regions 131, widths of the first regions 131 and the second region 132, and the height of the first layer 132-1 have been described above with reference to the embodiment illustrated in FIG. 6, and thus a detailed description thereof will not be repeated.

Figure 11:
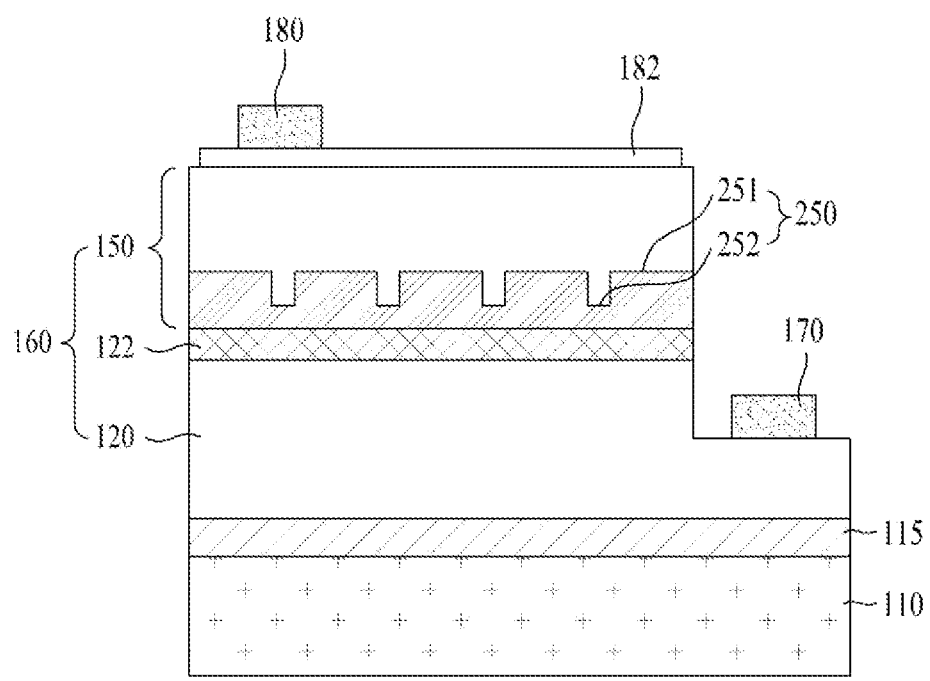
FIG. 11 is a cross-sectional view illustrating a light emitting device according to another embodiment.

FIG. 11 is a cross-sectional view illustrating a light emitting device 100E according to another embodiment. No description will be given of the configuration of FIG. 11 identical to the configuration described above. That is, the following description will be given only in conjunction with configurations different from those described above.

Referring to FIG. 11, the light emitting device 100E according to the illustrated embodiment is a horizontal light emitting device including a first-conductive-type semiconductor layer 120, a second-conductive-type semiconductor layer 150, and an active layer 122 interposed between the first-conductive-type semiconductor layer 120 and the second-conductive-type semiconductor layer 150.

The second-conductive-type semiconductor layer 150 includes an EBL 250 closely disposed to the active layer 122, and the EBL 250 has first regions 251 and second regions 252 having different heights. The first region 251 has a greater height than the second region 252. Accordingly, the EBL 250 has a convex-concave structure having convex portions constituting the first regions 251 and concave portions constituting the second regions 252.

Since the light emitting device 100E illustrated in FIG. 11 is a horizontal light emitting device, the first regions 251 protrude upward of the light emitting device 100E in the EBL 250 having the convex-concave structure.

The first regions 251 of the EBL 250 may be patterned to form a periodic array or an aperiodic array.

The shape of the pattern of the first regions 251 and widths and areas of the first regions 251 and the second region 252 have been described above, and thus a detailed description thereof will not be repeated.

Figure 12:
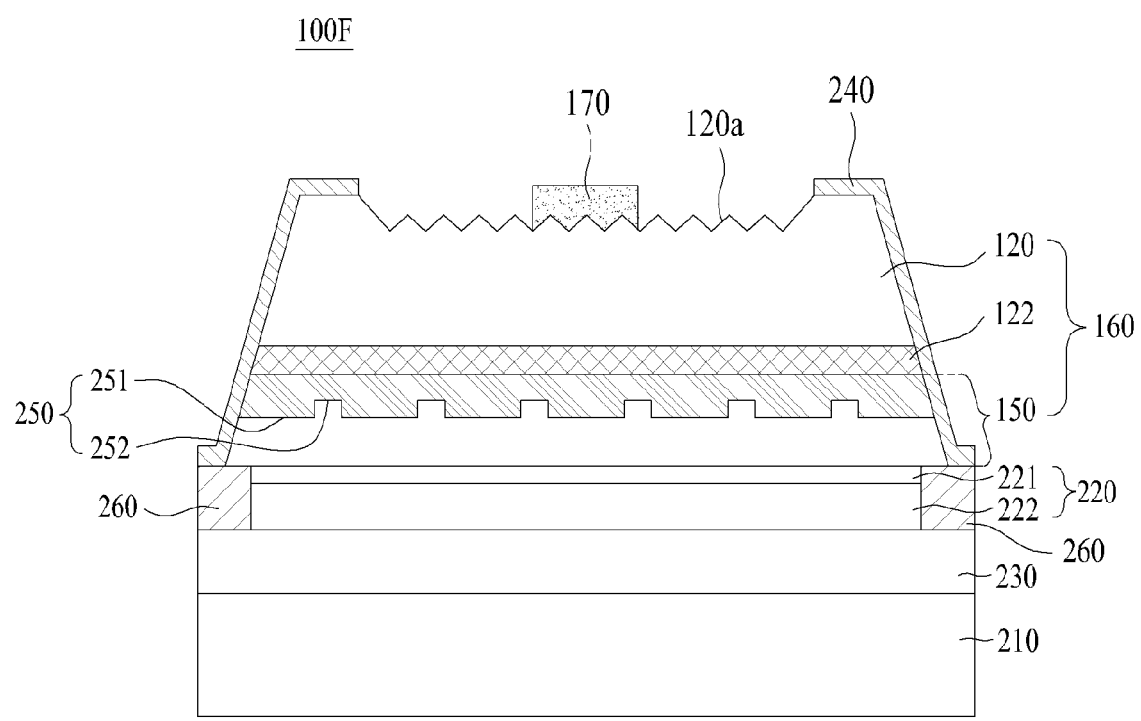
FIG. 12 is a cross-sectional view illustrating a light emitting device according to another embodiment.

FIG. 12 is a cross-sectional view illustrating a light emitting device 100F according to another embodiment. No description will be given of the configuration of FIG. 12 identical to the configuration described above. That is, the following description will be given only in conjunction with configurations different from those described above.

Referring to FIG. 12, the light emitting device 100F according to the illustrated embodiment is a vertical light emitting device including a first-conductive-type semiconductor layer 120, a second-conductive-type semiconductor layer 150, and an active layer 122 interposed between the first-conductive-type semiconductor layer 120 and the second-conductive-type semiconductor layer 150. The second-conductive-type semiconductor layer 150 includes an EBL 250 closely disposed to the active layer 122. The EBL 250 includes first regions 251 and second regions 252 having different heights. The first region 251 has a greater height than the second region 252. Thus, the EBL 250 has a convex-concave structure having convex portions constituting the first regions 251 and concave portions constituting the second regions 252.

Since the light emitting device 100F illustrated in FIG. 12 is a vertical light emitting device, the first regions 251 protrude downward of the light emitting device 100F in the EBL 250 having the convex-concave structure.

The first regions 251 of the EBL 250 may be patterned to form a periodic array or an aperiodic array.

The shape of the pattern of the first regions 251 and widths and areas of the first regions 251 and the second region 252 have been described above, and thus a detailed description thereof will not be repeated.

FIGS. 13 to 16 are views illustrating a method of manufacturing a light emitting device according to an exemplary embodiment. Hereinafter, the method of manufacturing the light emitting device illustrated in FIG. 2 will be described with reference to FIGS. 13 to 16.

Figure 13:
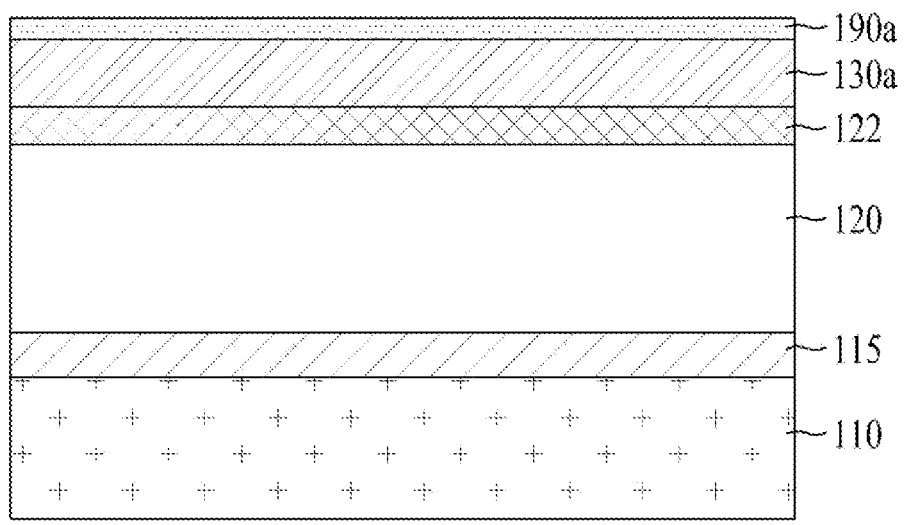
FIGS. 13 to 16 are views illustrating a method of manufacturing a light emitting device according to an exemplary embodiment.

First, referring to FIG. 13, a buffer layer 115 is grown over the substrate 110 to improve crystalline quality of light emitting structure 160, which will be grown later. Then, the first-conductive-type semiconductor layer 120 and the active layer 122 are grown over the buffer layer 115. The buffer layer 115 and the light emitting structure 160 may be grown using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like.

Then, an electron blocking material 130a is disposed over the active layer 122.

The electron blocking material 130a may be represented by formula $In_xAl_yGaN_{1-x-y}$, and may have an AlGaN single layer or a multilayer of AlGaN/GaN or InAlGaN/GaN.

An Al layer 190a is disposed on the electron blocking material 130a. The Al layer 190a may be deposited by thermal deposition or sputtering, but the present disclosure is not limited thereto.

Figure 14:
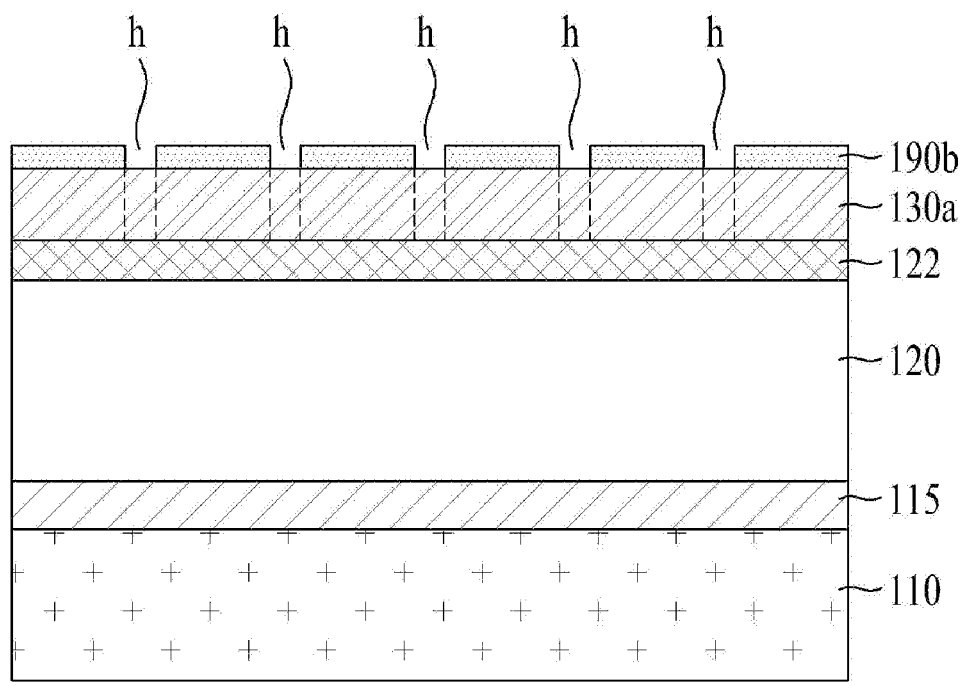

Referring to FIG. 14, the Al layer 190a is subjected to anodic oxidization to form an anodic aluminum oxide (AAO) layer 190b having a plurality of holes that expose the electron blocking material 130a. The anodic oxidization used to form the anodic aluminum oxide layer 190b having a plurality of holes is well known in the art.

Since the electron blocking material 130a is partially exposed at portions where holes are disposed in the anodic aluminum oxide layer 190b, the electron blocking material 130a may be etched using the anodic aluminum oxide layer 190b as a mask. The electron blocking material 130a may be removed using a dry etching process or a wet etching process. An etching depth of the electron blocking material 130a may vary according to embodiments.

Figure 15:
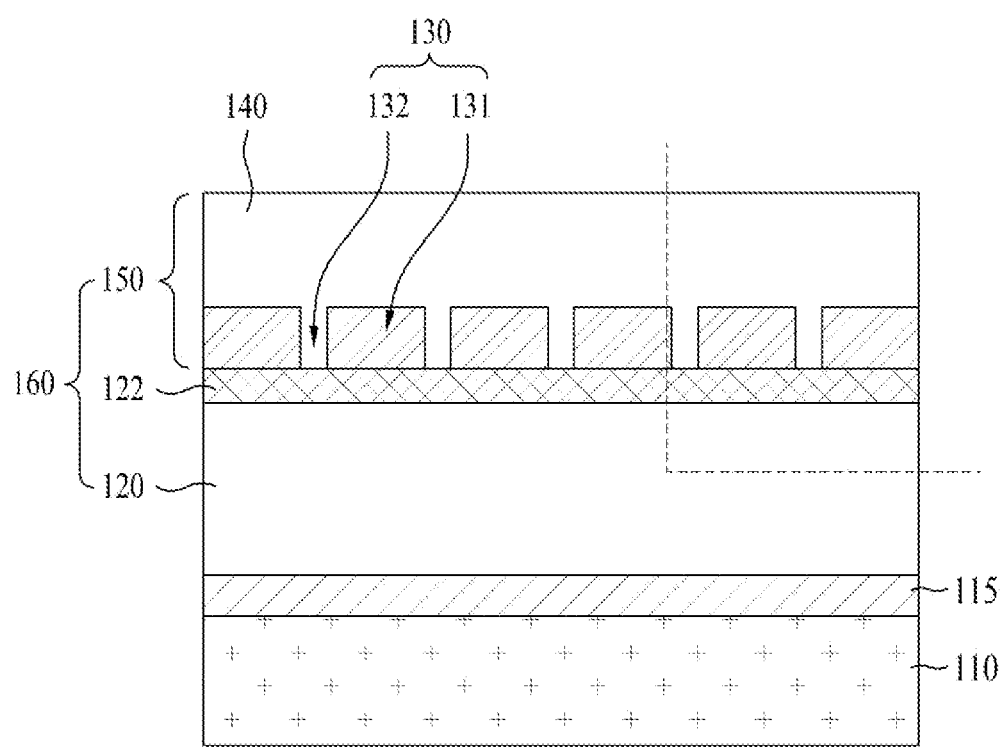

Referring to FIG. 15, the electron blocking material 130a is entirely removed at portions of the EBL 130 exposed via holes h, and the second-conductive-type clad layer 140 is grown in the portions from which the electron blocking material 130a is removed, thus forming the EBL 130 as described above with reference to the embodiment illustrated in FIG. 2.

The second-conductive-type semiconductor layer 150, the active layer 122, and the first-conductive-type semiconductor layer 120 are partially and selectively etched.

Figure 16:
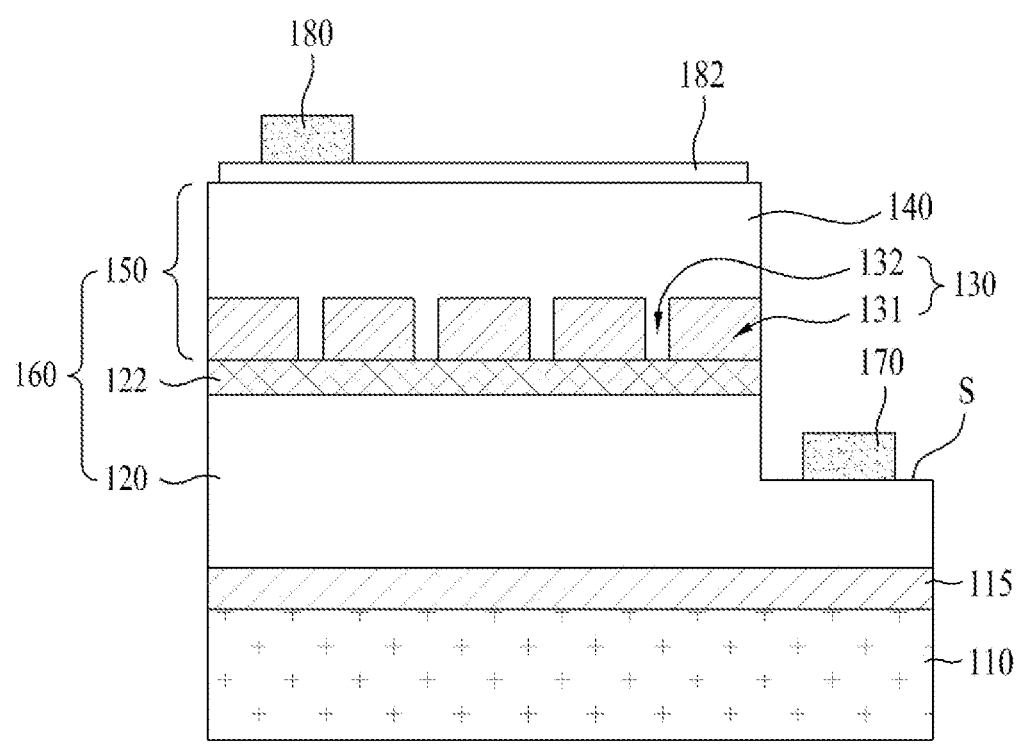

Referring to FIG. 16, a first electrode 170 is disposed on the exposed portion of the first-conductive-type semiconductor layer 120 by the selective etching, and a second electrode 180 is disposed on a non-etched portion of the second-conductive-type semiconductor layer 150. Before forming the second electrode 180, a transparent electrode 182 may be disposed on the second-conductive-type semiconductor layer 150.

The method of manufacturing the light emitting device is an example, and orders and processes thereof may be modified in various manners according to embodiments.

Figure 17:
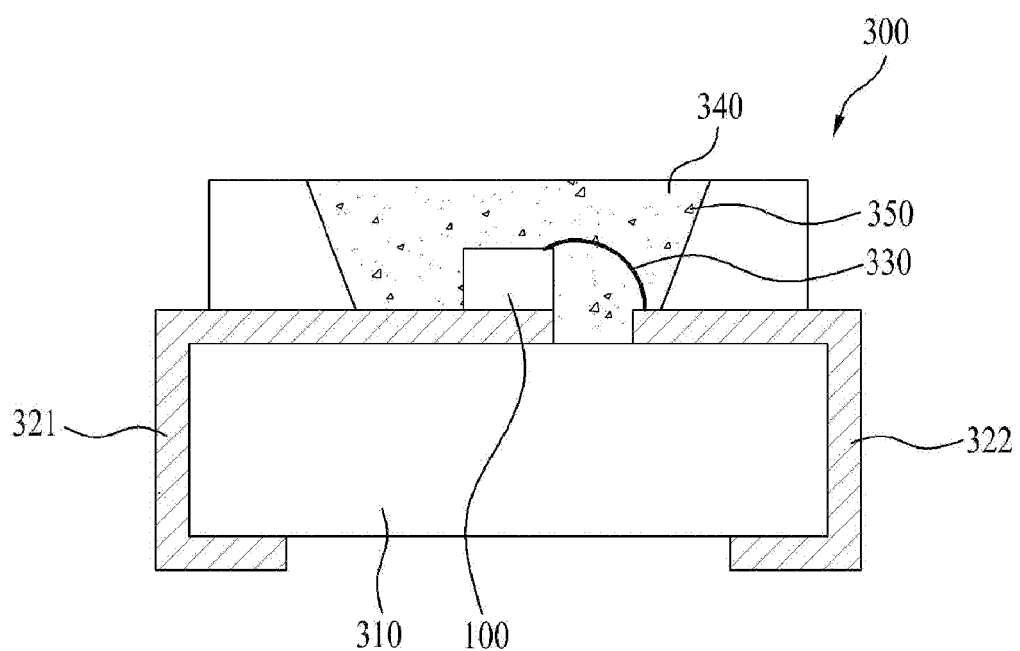
FIG. 17 is a view illustrating a light emitting device package according to an embodiment including a light emitting device according to the above-described embodiment.

FIG. 17 is a cross-sectional view illustrating a light emitting device package 300 according to an embodiment including a light emitting device according to the above-described embodiment.

The light emitting device package 300 according to the illustrated embodiment includes a body 310, first and second lead frames 321 and 322 mounted on the body 310, the light emitting device 100 according to one of the above-described embodiments, which is mounted on the body 300, to be electrically connected to the first and second lead frames 321 and 322, and a mold 340 formed in a cavity. The body 310 may have a cavity.

The body 310 may be made of a silicon material, a synthetic resin material, or a metallic material. When the body 310 is made of a conductive material such as a metallic material, an insulating layer is coated over the surface of the body 310, although not shown, in order to avoid electrical short circuit between the first and second lead frames 321 and 322.

The first and second lead frames 321 and 322 are electrically isolated from each other and supply current to the light emitting device 100. The first and second lead frames 321 and 322 may also reflect light generated from the light emitting device 100 so as to achieve an enhancement in luminous efficacy. In addition, the first and second lead frames 321 and 322 may function to outwardly dissipate heat generated from the light emitting device 100.

The light emitting device 100 may be mounted on the body 310 or on the first lead frame 321 or second lead frame 322. In the illustrated embodiment, the light emitting device 100 is directly electrically connected to the first lead frame 321 while being connected to the second lead frame 322 via a wire 330. The light emitting device 100 may be connected to the lead frames 321 and 322, using a flip-chip method or a die-bonding method, in place of the wire-bonding method.

The mold 340 encapsulates the light emitting device 100, to protect the light emitting device 100. The mold 340 includes phosphors 350, to change the wavelength of light emitted from the light emitting device 100.

The phosphors 350 may include garnet-based phosphors, silicate-based phosphors, nitride-based phosphors, or oxynitride-based phosphors.

For example, the garnet-based phosphors may be YAG $(Y_3Al_5O_{12}:Ce^{3+})$ or TAG $(Tb_3Al_5O_{12}:Ce^{3+})$. The silicate-based phosphors may be $(Sr,Ba,Mg,Ca)_2SiO_4:Eu^{2+}$. The nitride-based phosphors may be $CaAlSiN_3:Eu^{2+}$ containing SiN. The oxynitride-based phosphors may be $Si_{6-x}Al_xO_xN_{8-x}:Eu^{2+}$ $(0<x<6)$.

Light of a first wavelength range emitted from the light emitting device 100 is excited by the phosphors 350 so as to be changed into light of a second wavelength range. As the light of the second wavelength range passes through a lens (not shown), the optical path thereof may be changed.

A plurality of light emitting device packages, each of which has the above-described structure according to the illustrated embodiment, is prepared, and is then arrayed on a substrate. Optical members, namely, light guide plates, prism sheets, diffusion sheets, and the like, may be arranged on optical paths of the light emitting device packages. Such light emitting device packages, substrate, and optical members may function as a light unit. In accordance with another embodiment, a display apparatus, an indication apparatus or a lighting system may be implemented using the semiconductor light emitting devices or light emitting device packages described in conjunction with the above-described embodiments. Examples of the lighting system may include a lamp or a street lamp.

Hereinafter, a headlamp and a backlight unit as embodiments of the lighting system including the above-described light emitting device packages will be described.

Figure 18:
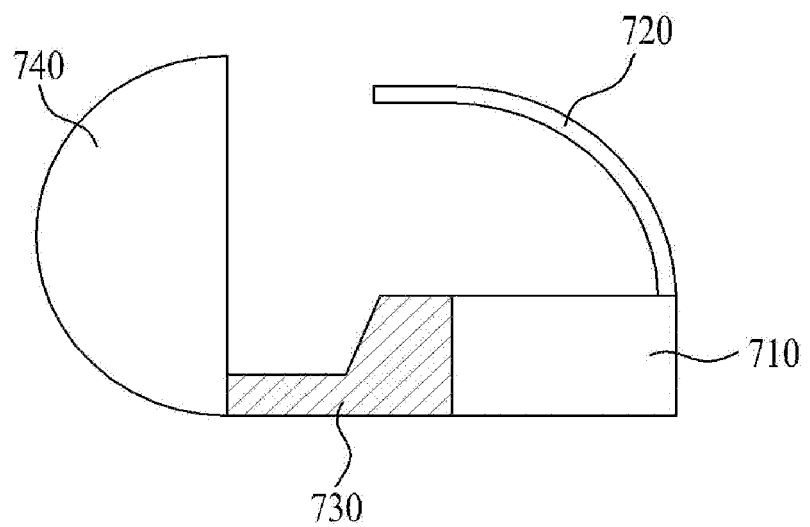
FIG. 18 is a view illustrating a headlamp according to an embodiment, in which a light emitting device according to the above-described embodiment is disposed.

FIG. 18 is a view illustrating a headlamp according to an exemplary embodiment, in which a light emitting device according to the above-described embodiment is disposed.

Referring to FIG. 18, light emitted from a light emitting module 710, in which a light emitting device according to the above-described embodiment is disposed, is reflected by a reflector 720 and a shade 730 and passes through a lens 740, thereby being launched forward from a vehicle body.

A plurality of light emitting devices may be mounted on a circuit board of the light emitting module 710, but the present disclosure is not limited thereto.

Figure 19:
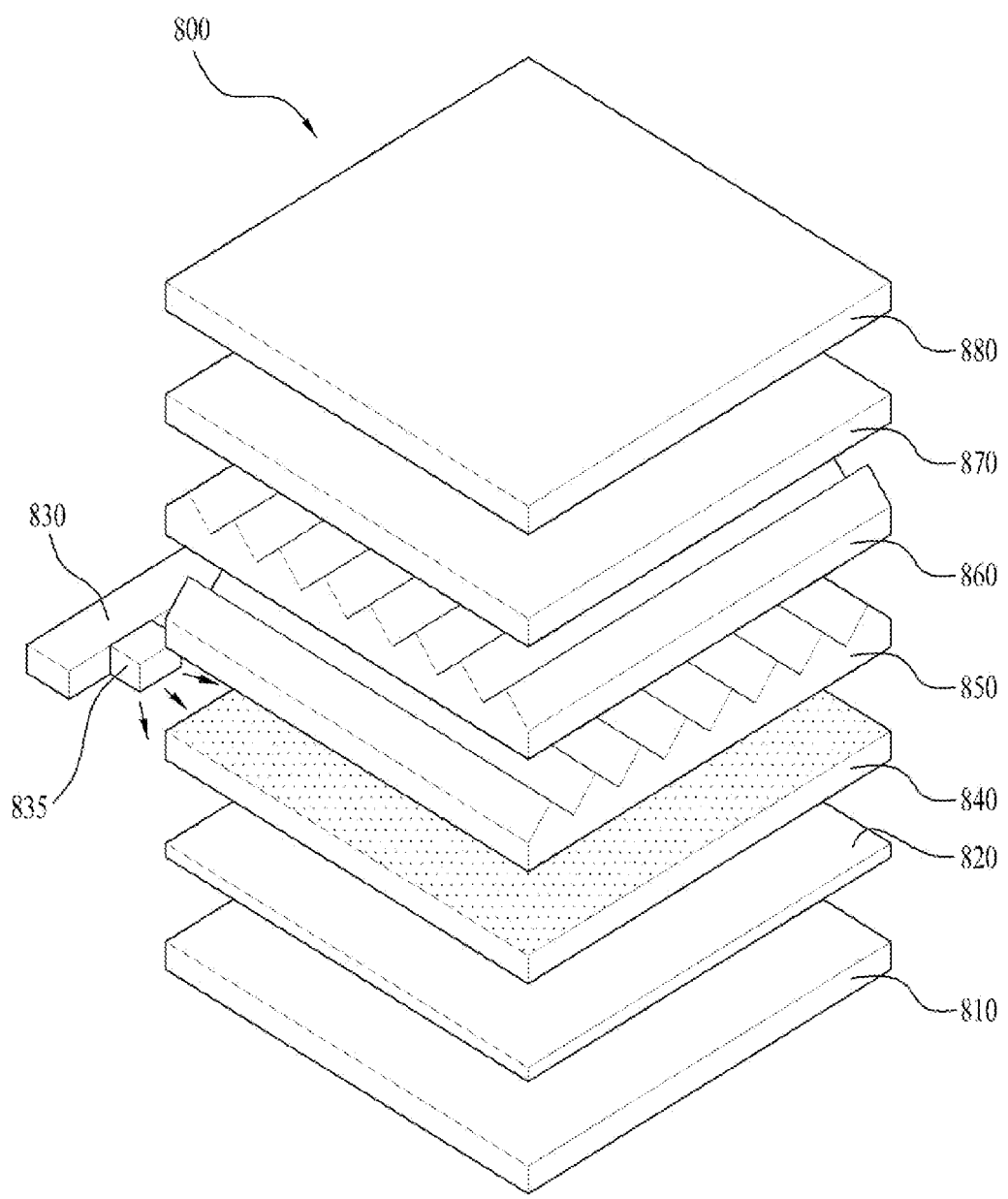
FIG. 19 is a view illustrating a display apparatus according to an embodiment in which a light emitting device package according to the above-described embodiment is disposed.

FIG. 19 is a view illustrating a display apparatus 800 according to an embodiment in which a light emitting device package according to the above-described embodiment is disposed.

Referring to FIG. 19, the display apparatus 800 according to the illustrated embodiment includes a light emitting module, a reflective plate 820 disposed on a bottom cover 810, a light guide plate 840 disposed in front of the reflective plate 820 to guide light emitted from the light emitting module to a front side of the display apparatus 800, first and second prism sheets 850 and 860 disposed in front of the light guide plate 840, a panel 870 disposed in front of the second prism sheet 860, and a color filter 880 disposed in front of the panel 870.

The light emitting module includes a circuit board 830 and light emitting device packages 835 mounted on the circuit board 830. Here, a printed circuit board (PCB) may be used as the circuit board 830. The light emitting device packages 835 may have the configuration described above in conjunction with FIG. 17.

The bottom cover 810 serves to receive the constituent elements of the display apparatus 800. The reflective plate 820 may be provided as a separate element, as shown in FIG. 19, or may be formed as a material having high reflectivity is coated over a rear surface of the light guide plate 840 or a front surface of the bottom cover 810.

Here, the reflective plate 820 may be made of a material having high reflectivity and capable of being formed into an ultra thin structure. Polyethylene terephthalate (PET) may be used for the reflective plate 820.

The light guide plate 840 serves to scatter light emitted from the light source module so as to uniformly distribute the light throughout all regions of a liquid crystal display apparatus. Therefore, the light guide plate 840 may be made of a material having high refractivity and transmittance. The material of the light guide plate 840 may include polymethylmethacrylate (PMMA), polycarbonate (PC) or polyethylene (PE). The light guide plate may be dispensed with. In this case, an air guide system, which transfers light in a space over the reflective sheet 820, may be implemented.

The first prism sheet 850 may be formed by coating a polymer exhibiting light transmittance and elasticity over one surface of a base film. The first prism sheet 850 may have a prism layer having a plurality of three-dimensional structures in the form of a repeated pattern. Here, the pattern may be of a stripe type in which ridges and valleys are repeated.

The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light emitting module and the reflective sheet 820 toward the entire surface of the panel 870.

In the illustrated embodiment, an optical sheet may be constituted by the first prism sheet 850 and the second prism sheet 860. However, the optical sheet may include other combinations, for example, a microlens array, a combination of a diffusion sheet and a microlens array, and a combination of a prism sheet and a microlens array.

A liquid crystal display panel may be used as the panel 870. Further, instead of the liquid crystal display panel 870, other kinds of display devices requiring light sources may be provided.

The panel 870 is configured such that a liquid crystal layer is located between glass bodies, and polarizing plates are mounted on both glass bodies so as to utilize polarizing properties of light. Here, the liquid crystal layer has properties between a liquid and a solid. That is, in the liquid crystal layer, liquid crystals which are organic molecules having fluidity like a liquid are regularly oriented, and the liquid crystal layer displays an image using change of such molecular orientation due to an external electric field.

The liquid crystal display panel used in the display apparatus is of an active matrix type, and uses transistors as switches to adjust voltage applied to each pixel.

The color filter 880 is provided on the front surface of the panel 870, and transmits only a red, green or blue light component of light projected from the panel 870 per pixel, thereby displaying an image.

As is apparent from the above description, internal quantum efficiency of a light emitting device may be improved by blocking overflow of electrons and improving hole injection efficiency by use of an EBL.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first-conductive-type semiconductor layer;
a second-conductive-type semiconductor layer; and
an active layer interposed between the first-conductive-type semiconductor layer and the second-conductive-type semiconductor layer,
wherein the second-conductive-type semiconductor layer comprises an electron blocking layer including a plurality of first regions and a plurality of second regions,
wherein the plurality of first regions and the plurality of second regions are disposed directly on the active layer through respective portions of said first and second regions that differ in composition from each other, and
wherein each one of the plurality of first regions is spaced apart from any of the plurality of first regions adjacent to said one of the plurality of first regions by one of the plurality of second regions.

2. The light emitting device according to claim 1, wherein the first and second regions comprise an AlGaN single layer, an AlGaN/GaN multilayer, or an InAlGaN/GaN multilayer.

3. The light emitting device according to claim 1, wherein the first regions are disposed periodically.

4. The light emitting device according to claim 1, wherein each of the first regions has a width of 50 nm to 200 nm.

5. The light emitting device according to claim 1, wherein each one of the plurality of first regions is spaced apart from an adjacent one of the plurality of first regions by a distance of 5 nm to 50 nm.

6. The light emitting device according to claim 1, further comprising a transparent electrode layer disposed on the second-conductive-type semiconductor layer.

7. A light emitting device comprising:
a first-conductive-type semiconductor layer;
a second-conductive-type semiconductor layer; and
an active layer interposed between the first-conductive-type semiconductor layer and the second-conductive-type semiconductor layer,
wherein the second-conductive-type semiconductor layer comprises an electron blocking layer disposed on the active layer and a second-conductive-type clad layer formed on the electron blocking layer,
wherein the electron blocking layer comprises a plurality of first regions disposed in a spaced pattern and spaced apart from each other by a second region,
wherein the second region is disposed between adjacent first regions,
wherein the plurality of first regions and the second region are disposed directly on the active layer through respective portions of said first regions and said second region that differ in composition from each other, and
wherein the plurality of first regions are formed of a material having a greater energy bandgap than that of the second region.

8. The light emitting device according to claim 7, wherein each of the plurality of first regions is an electron blocking region and the second region is a hole injection region.

9. The light emitting device according to claim 7, wherein the second region comprises a material having the same composition as the second-conductive-type clad layer.

10. A light emitting device comprising:
a first-conductive-type semiconductor layer;
a second-conductive-type semiconductor layer; and
an active layer interposed between the first-conductive-type semiconductor layer and the second-conductive-type semiconductor layer,
wherein the second-conductive-type semiconductor layer comprises an electron blocking layer disposed on the active layer and a second-conductive-type clad layer formed on the electron blocking layer,
wherein the electron blocking layer comprises a plurality of first regions disposed in a spaced pattern and spaced apart from each other and a second region disposed between adjacent first regions,
wherein the plurality of first regions and the second region are disposed directly on the active layer through respective portions of said first and second regions that differ in composition from each other,
wherein the second region comprises a first layer disposed directly on the active layer and a second layer disposed directly on the second-conductive-type clad layer,
wherein the first layer is formed of materials having a different energy bandgap than that of the second layer, and
wherein the first region is formed of materials having a different energy bandgap than that of the first layer.

11. The light emitting device according to claim 10, wherein the first layer is thinner than the first regions.

12. The light emitting device according to claim 10, wherein a surface of the first layer adjacent to the active layer is aligned in the same line as a surface of the first regions adjacent to the active layer.

13. The light emitting device according to claim 10, wherein the first layer has a thickness of 1 nm to 20 nm.

14. The light emitting device according to claim 10, wherein the first layer has a thickness of 10% to 50% of a thickness of the first regions.

15. The light emitting device according to claim 1, wherein each of the plurality of first regions has a hexagonal or circular cross-section.

16. The light emitting device according to claim 7, wherein each of the first regions has a hexagonal or a circular cross-section.

17. The light emitting device according to claim 7, wherein a ratio of a width of a spacing between adjacent first regions to a sum of said width and a width of a first region of said adjacent first regions is in the range of 2.4% to 50%.

18. The light emitting device according to claim 7, wherein a ratio of an area of the second region to a total cross-sectional area of the electron blocking layer is in the range of 5% to 80%.

19. The light emitting device according to claim 7, wherein each of the first regions has higher resistance than the second region.

20. The light emitting device according to claim 10, wherein a thickness of the first layer is smaller than that of each of the first regions.

* * * * *